(12) United States Patent
Nitta et al.

(10) Patent No.: US 7,623,173 B2
(45) Date of Patent: Nov. 24, 2009

(54) SOLID-STATE IMAGE PICKUP DEVICE HAVING ANALOG-DIGITAL CONVERTERS CONFIGURED TO SUM VALUES OF MULTIPLE PIXELS IN THE ARRAY AND METHOD FOR DRIVING THE SAME

(75) Inventors: Yoshikazu Nitta, Tokyo (JP); Noriyuki Fukushima, Kanagawa (JP); Yoshinori Muramatsu, Kanagawa (JP); Yukihiko Yasui, Kanagawa (JP)

(73) Assignee: Sony Corporation, Tokyo (JP)

( * ) Notice: Subject to any disclaimer, the term of this patent is extended or adjusted under 35 U.S.C. 154(b) by 724 days.

(21) Appl. No.: 11/058,851

(22) Filed: Feb. 16, 2005

(65) Prior Publication Data

US 2005/0195304 A1 Sep. 8, 2005

(30) Foreign Application Priority Data

Feb. 23, 2004 (JP) ............................. P2004-045943
Jul. 15, 2004 (JP) ............................. P2004-208038

(51) Int. Cl.
*H04N 3/14* (2006.01)
*H04N 5/335* (2006.01)

(52) U.S. Cl. .................. 348/302; 348/297; 348/308
(58) Field of Classification Search ................ 348/297, 348/298, 299, 302, 308
See application file for complete search history.

(56) References Cited

U.S. PATENT DOCUMENTS 4,710,817 A * 12/1987 Ando ........................ 348/310
4,903,028 A * 2/1990 Fukushima ................. 341/156
4,996,413 A    2/1991 McDaniel et al.
5,014,056 A * 5/1991 Moriwaki .................... 341/161
5,877,715 A * 3/1999 Gowda et al. ............... 341/122
5,920,274 A * 7/1999 Gowda et al. ............... 341/155
6,067,113 A * 5/2000 Hurwitz et al. ............. 348/241
6,330,030 B1 * 12/2001 O'Connor ................... 348/297
6,423,957 B1 * 7/2002 Kim et al. ................. 250/208.1
6,498,576 B1 * 12/2002 Tian et al. ................... 341/155
6,587,145 B1 * 7/2003 Hou ........................... 348/297
6,590,610 B2 * 7/2003 Castro et al. ................ 348/297
6,667,769 B2 * 12/2003 Harton et al. ............... 348/308
6,831,580 B2 * 12/2004 Bae ............................ 341/144
6,867,804 B1 * 3/2005 Kim et al. ................... 348/294
6,965,407 B2 * 11/2005 Boemler et al. ............. 348/302

(Continued)

FOREIGN PATENT DOCUMENTS

JP           04-220239         8/1992

OTHER PUBLICATIONS

W. Yang et al., "An Integrated 800x600 CMOS Image System" ISSCC Digest of Technical Papers, pp. 304-330, Feb. 1999.

(Continued)

*Primary Examiner*—John M Villecco
(74) *Attorney, Agent, or Firm*—Sonnenschein Nath & Rosenthal LLP

(57) ABSTRACT

A CMOS image sensor includes column-parallel ADCs. Each of the ADCs includes a comparator and an up/down counter. With this configuration, digital values of pixels in a plurality of rows can be added without using additional circuits, such as an adder and a line memory device, and the frame rate can be increased while maintaining constant sensitivity.

11 Claims, 18 Drawing Sheets

U.S. PATENT DOCUMENTS

| | | | |
|---|---|---|---|
| 7,088,279 B2 * | 8/2006 | Muramatsu et al. | 341/155 |
| 7,129,883 B2 * | 10/2006 | Muramatsu et al. | 341/164 |
| 7,242,820 B2 * | 7/2007 | Nam | 382/312 |
| 7,310,452 B2 * | 12/2007 | Nam | 382/312 |
| 7,315,273 B2 * | 1/2008 | Muramatsu et al. | 341/164 |
| 7,321,329 B2 * | 1/2008 | Tooyama et al. | 341/163 |
| 7,324,033 B2 * | 1/2008 | Asayama et al. | 341/145 |
| 7,375,672 B2 * | 5/2008 | Muramatsu et al. | 341/164 |
| 7,379,011 B2 * | 5/2008 | Ham et al. | 341/170 |
| 2005/0253942 A1 * | 11/2005 | Muramatsu et al. | 348/273 |
| 2006/0012507 A1 * | 1/2006 | Nitta et al. | 341/156 |
| 2006/0012698 A1 * | 1/2006 | Nitta et al. | 348/308 |
| 2006/0013485 A1 * | 1/2006 | Nitta et al. | 382/194 |
| 2006/0214086 A1 * | 9/2006 | Fukushima | 250/208.1 |
| 2006/0284999 A1 * | 12/2006 | Muramatsu et al. | 348/308 |
| 2007/0019091 A1 * | 1/2007 | Muramatsu et al. | 348/308 |
| 2007/0024728 A1 * | 2/2007 | Muramatsu et al. | 348/308 |
| 2007/0024729 A1 * | 2/2007 | Muramatsu et al. | 348/308 |
| 2007/0024730 A1 * | 2/2007 | Muramatsu et al. | 348/308 |
| 2007/0024731 A1 * | 2/2007 | Muramatsu et al. | 348/308 |
| 2007/0194962 A1 * | 8/2007 | Asayama et al. | 341/144 |
| 2008/0042048 A1 * | 2/2008 | Asayama et al. | 250/208.1 |
| 2008/0094271 A1 * | 4/2008 | Tooyama et al. | 341/155 |
| 2008/0111905 A1 * | 5/2008 | Toyama et al. | 348/308 |

OTHER PUBLICATIONS

M. Loose et al., "2/3-inch CMOS Imaging Sensor for High Definition Television", 2001 IEEE Workshop on CMOS and CCD Imaging Sensors.

Japanese office action, dated Dec. 11, 2007 (4 pages).

European Search Report, dated Oct. 10, 2007 (3 pages).

* cited by examiner

Ｕ Ｓ ７,６２３,１７３ Ｂ２

SOLID-STATE IMAGE PICKUP DEVICE HAVING ANALOG-DIGITAL CONVERTERS CONFIGURED TO SUM VALUES OF MULTIPLE PIXELS IN THE ARRAY AND METHOD FOR DRIVING THE SAME

RELATED APPLICATION DATA

The present application claims priority to Japanese Application(s) No(s). P2004-045943 filed Feb. 23, 2004, and P2004-208038 filed Jul. 15, 2004, which application(s) is/are incorporated herein by reference to the extent permitted by law.

BACKGROUND OF THE INVENTION

1. Field of the Invention

The present invention relates to a solid-state image pickup device and a method for driving the same. Particularly, the present invention relates to a solid-state image pickup device for converting analog signals output from unit pixels through column signal lines to digital signals and reading the digital signals, and to a method for driving the same.

2. Description of the Related Art

In recent years, a CMOS image sensor including a column-parallel ADCs (analog-digital converters) has been reported (e.g., see non-Patent Document 1: W. Yang et al., "An Integrated 800×600 CMOS Image System" ISS CC Digest of Technical Papers, pp. 304-305, February 1999). In this CMOS image sensor, ADCs are arranged for respective columns in matrix-patterned unit pixels.

FIG. 15 is a block diagram showing the configuration of a CMOS image sensor 100 including column-parallel ADCs according to a known art.

In FIG. 15, unit pixels 101, each including a photodiode and an intra-pixel amplifier, are two-dimensionally arranged in a matrix pattern so as to form a pixel array unit 102. In the matrix-pattern arrangement of the pixel array unit 102, row control lines 103 (103-1, 103-2, . . . ) are arranged for respective rows and column signal lines 104 (104-1, 104-2, . . . ) are arranged for respective columns. The row address and row scanning in the pixel array unit 102 is controlled by a row scanning circuit 105 through the row control lines 103-1, 103-2, . . . .

An ADC 106 is disposed at one end of each of the column signal lines 104-1, 104-2, . . . , so that a column processing unit (column-parallel ADC block) 107 is formed. Further, a digital-analog converter (hereinafter referred to as a DAC) 108 for generating a reference voltage Vref having a RAMP waveform and a counter 109 for measuring the time of a comparing operation in a comparator 110 (to be described later) by performing a counting operation in synchronization with a clock CK of a predetermined period are provided for the ADCs 106.

Each of the ADCs 106 includes the comparator 110 for comparing an analog signal obtained from the unit pixel 101 in a selected row among the row control lines 103-1, 103-2, . . . , through the column signal line 104-1, 104-2, or . . . , with a reference voltage Vref generated by the DAC 108; and a memory device 111 for holding the count value of the counter 109 in response to the output of the comparator 110. The ADC 106 has a function of converting an analog signal supplied from each unit pixel 101 to a digital signal of N bits.

Control of a column address and column scanning to each ADC 106 in the column processing unit 107 is performed by a column scanning circuit 112. That is, digital signals of N bits which have been AD converted by the ADCs 106 are sequentially read into a horizontal output line 113 having a width of 2N bits by column scanning of the column scanning circuit 112 and the signals are transmitted to a signal processing circuit 114 through the horizontal output line 113. The signal processing circuit 114 includes sensing circuits, subtraction circuits, and output circuits, the number thereof being 2N corresponding to the horizontal output line 113 having a width of 2N bits.

A timing control circuit 115 generates clock signals and timing signals required by the operations of the row scanning circuit 105, the ADCs 106, the DAC 108, the counter 109, and the column scanning circuit 112 based on a master clock MCK, and supplies the clock signals and timing signals to corresponding circuits.

Next, the operation of the CMOS image sensor 100 having the above-described configuration according to the known art will be described with reference to the timing chart shown in FIG. 16.

After a first reading operation from the unit pixels 101 of a selected row to the column signal lines 104-1, 104-2, . . . , has become stable, a reference voltage Vref of a ramp waveform is supplied from the DAC 108 to each of the comparators 110. Accordingly, the respective comparators 110 compare the signal voltage Vx of the column signal lines 104-1, 104-2, . . . , with the reference voltage Vref. In this comparing operation, the polarity of the output Vco of the comparator 110 is reversed when the reference voltage Vref and the signal voltage Vx become equal to each other. In response to the reversed output of the comparator 110, a count value N1 of the counter 109 according to the comparison time in the comparator 110 is stored in the memory device 111.

In the first reading operation, a reset component ΔV of each unit pixel 101 is read. The reset component ΔV includes fixed pattern noise as offset, which varies in each unit pixel 101. However, since the variation of the reset component ΔV is generally small and the reset level is common in all the pixels, the signal voltage Vx of the column signal lines 104 at the first reading operation is approximately known. Therefore, at the first operation of reading the reset component ΔV, the comparison time in the comparator 110 can be shortened by adjusting the reference voltage Vref of a ramp waveform. In the known art, the reset component ΔV is compared in a count period of 7 bits (128 clocks).

In a second reading operation, a signal component according to the amount of incident light in each unit pixel 101 is read in addition to the reset component ΔV in the same manner as in the first reading operation. That is, after the second reading operation from the unit pixels 101 in the selected row to the column signal lines 104-1, 104-2, . . . , has become stable, the reference voltage Vref of a ramp waveform is supplied from the DAC 108 to each of the comparators 110. Accordingly, the respective comparators 110 compare the signal voltage Vx of the corresponding column signal lines 104-1, 104-2, . . . , with the reference voltage Vref.

At the same time when the reference voltage Vref is supplied to the comparators 110, the counter 109 starts second counting. Then, in the second comparing operation, the polarity of the output Vco of the comparator 110 is reversed when the reference voltage Vref and the signal voltage Vx become equal to each other. In response to the reversed output of the comparator 110, a count value N2 of the counter 109 according to the comparison time in the comparator 110 is stored in the memory device 111. The first count value N1 and the second count value N2 are stored in different areas in the memory device 111.

After the above-described series of AD converting operations, the column scanning circuit 112 performs column scanning, whereby the first and second N-bit digital signals held in each memory device 111 are supplied to the signal processing circuit 114 through 2N lines of the horizontal output line 113. Then, the subtraction circuit (not shown) in the signal processing circuit 114 performs subtraction (second signal)–(first signal) and the result is output. Then, the same operation is sequentially performed for the other rows, so that a two-dimensional image is formed.

In the CMOS image sensor including column-parallel ADCs according to the known art, each memory device 111 must hold the first and second count values N1 and N2. Thus, 2N memory devices 111 are required for an N-bit signal, so that the scale and area of the circuitry increases. Further, N-series clocks CK1 to CKN must be input from the counter 109 to the memory devices 111, so that clock noise and power consumption increase. Further, 2N lines are required in the horizontal output line 113 in order to output the first and second count values N1 and N2, and the current increases accordingly. In addition, N subtraction circuits are required for subtraction of the first and second count values N1 and N2 before output, so that the scale and area of the circuitry increase.

In order to realize high-speed imaging, a frame rate is increased by skip-reading pixel information (e.g., see non-Patent Document 2: M. Loose et al., "⅔-inch CMOS Imaging Sensor for High Definition Television", 2001, IEEE Workshop on CMOS and CCD Imaging sensors). By adopting this method, the frame rate of 60 frames per second can be realized in the interlaced scanning shown in FIG. 18, although the frame rate is 30 frames per second in the progressive scanning shown in FIG. 17. In other words, when pixel information to be output is read by skipping rows, for example, when the number of rows to be read is ½, the frame rate can be doubled.

However, in the known art described in non-Patent Document 2, that is, in the technique of increasing the frame rate by reading pixel information by skipping rows, the exposure time in each unit pixel is shortened as the frame rate increases. For example, the exposure time is reduced by half when the frame rate doubles. As a result, the effective sensitivity of the unit pixel is reduced by half. Therefore, when the frame rate is increased by applying skip reading of pixel information in the CMOS image sensor 100 including column-parallel ADCs, the sensitivity of the unit pixel decreases due to the higher frame rate, and thus the sensitivity of imaging result decreases disadvantageously.

SUMMARY OF THE INVENTION

The present invention has been made in view of the above-described problems, and an object of the present invention is to provide a solid-state image pickup device capable of realizing a higher frame rate without decreasing sensitivity and a method for driving the solid-state image pickup device.

In order to achieve the above-described object, in the solid-state image pickup device of the present invention, unit pixels, each including a photoelectric converter, are two-dimensionally arranged in a matrix pattern, column signal lines arranged for respective columns of the matrix pattern, and the unit pixels are selectively controlled in units of rows sequentially. Analog signals are output from the unit pixels in a selectively controlled row through the column signal lines and converted to digital values. The obtained digital values are added among a plurality of pixel units and the added digital values are read.

In the solid-state image pickup device having this configuration, analog signals output from the unit pixels are converted to digital values and the digital values are added among a plurality of unit pixels and are read. In terms of the number of pieces of read pixel information, this operation is equivalent to interlaced reading (skip reading) of pixel information. However, the amount of each piece of pixel information is larger by X times if the number of pixels to be added is X. Therefore, even when the exposure time of the unit pixels is reduced to ½ in order to double the frame rate, the amount of each piece of pixel information is doubled by adding digital values of unit pixels between two rows at analog-digital conversion, so that a decrease of sensitivity can be prevented.

According to the present invention, in the solid-state image pickup device for converting analog signals output from unit pixels through column signal lines to digital values and reading the digital values, the digital values are added among a plurality of unit pixels and the added values are read. With this method, the amount of each piece of pixel information does not decrease even when the exposure time of the unit pixels is reduced. Accordingly, the frame rate can be increased while preventing a decrease in sensitivity.

DESCRIPTION OF THE PREFERRED EMBODIMENTS

Hereinafter, embodiments of the present invention will be described with reference to the drawings.

First Embodiment

Figure 1:
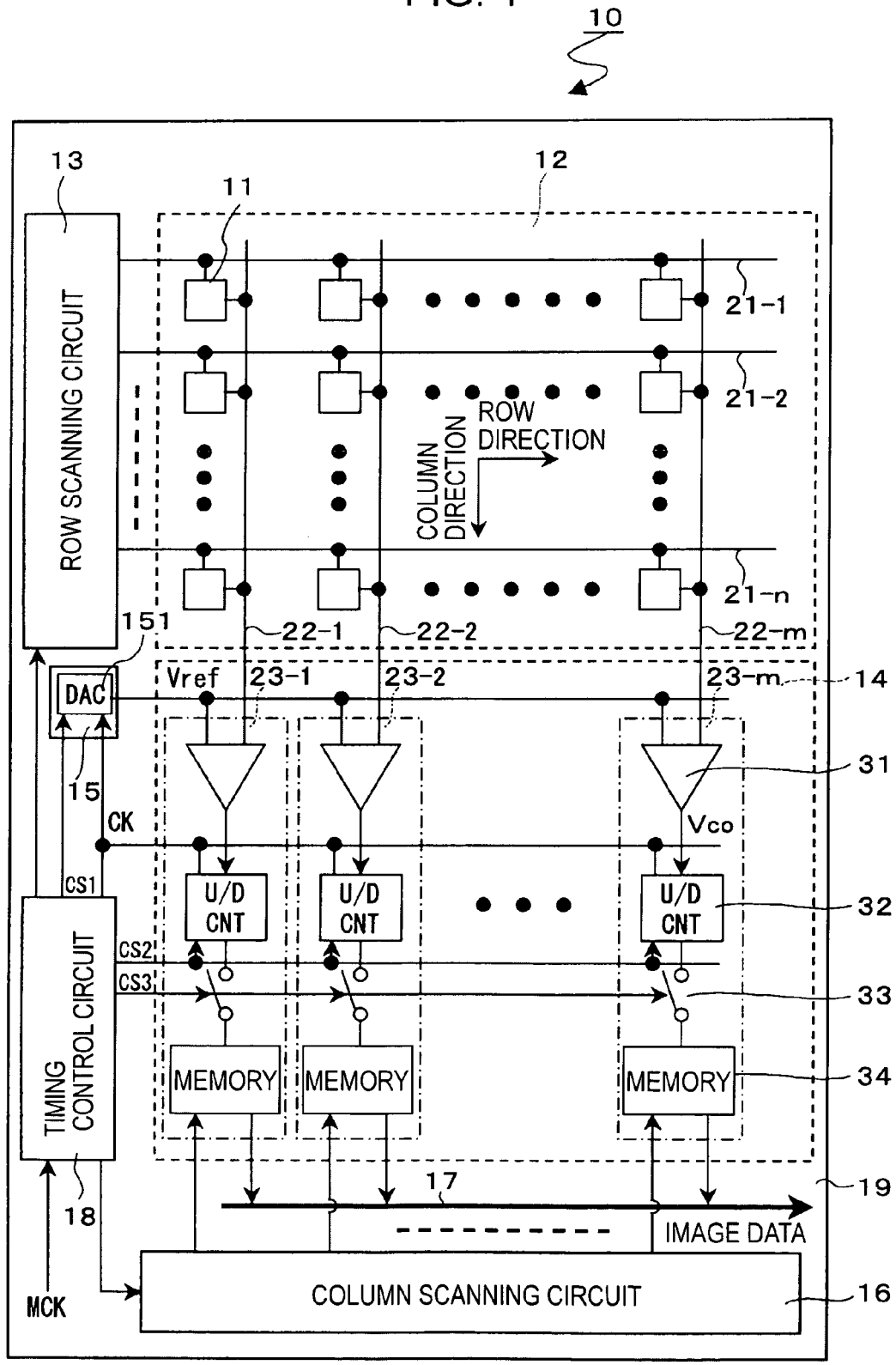
FIG. 1 is a block diagram showing the configuration of a CMOS image sensor including column-parallel ADCs according to a first embodiment of the present invention.

FIG. 1 is a block diagram showing the configuration of a solid-state image pickup device according to a first embodiment of the present invention, for example, a CMOS image sensor 10 including column-parallel ADCs. As shown in FIG. 1, the CMOS image sensor 10 according to this embodiment includes a pixel array unit 12, where unit pixels 11, each including a photoelectric transducer, are two-dimensionally arranged in a matrix pattern; a row scanning circuit 13, a column processing unit 14; a reference-voltage supplying unit 15; a column scanning circuit 16; a horizontal output line 17; and a timing control circuit 18.

In this system configuration, the timing control circuit 18 generates clock signals and control signals serving as reference of the operations of the row scanning circuit 13, the column processing unit 14, the reference-voltage supplying unit 15, the column scanning circuit 16, and so on, based on a master clock MCK, and supplies the signals to the row scanning circuit 13, the column processing unit 14, the reference-voltage supplying unit 15, the column scanning circuit 16, and so on.

A driving system and a signal processing system for driving and controlling each unit pixel 11 of the pixel array unit 12, that is, the row scanning circuit 13, the column processing unit 14, the reference-voltage supplying unit 15, the column scanning circuit 16, the horizontal output line 17, and the timing control circuit 18 are integrated in a chip (semiconductor substrate) 19 together with the pixel array unit 12.

Although not shown in the figure, the unit pixel 11 includes a photoelectric transducer (e.g., photodiode) and a three-transistor unit consisting of a transfer transistor for transferring a charge obtained by photoelectric conversion in the photoelectric transducer to an FD (floating diffusion) unit; a reset transistor for controlling the potential of the FD unit; and an amplifier transistor for outputting a signal according to the potential of the FD unit, or a four-transistor unit further including a selecting transistor for selecting a pixel.

In the pixel array unit 12, unit pixels 11 of m columns and n rows are two-dimensionally arranged, row control lines 21 (21-1 to 21-n) are arranged for the respective rows in the m columns and n rows of the unit pixels, and column signal lines 22 (22-1 to 22-m) are arranged for the respective columns. One end of each of the row control lines 21-1 to 21-n is connected to a corresponding output terminal of the row scanning circuit 13. The row scanning circuit 13 includes a shift register or the like and controls the row address and row scanning of the pixel array unit 12 through the row control lines 21-1 to 21-n.

The column processing unit 14 includes ADCs (analog-digital converters) 23-1 to 23-m, which are provided for the respective column signal lines 22-1 to 22-m of the pixel array unit 12. The ADCs 23-1 to 23-m convert analog signals output from the unit pixels 11 in the columns of the pixel array unit 12 to digital signals and output the digital signals. The present invention features the configuration of these ADCs 23-1 to 23-m, which will be described in detail later.

The reference-voltage supplying unit 15 includes a DAC (digital-analog converter) 151 serving as a unit for generating a reference voltage Vref having a so-called ramp waveform, in which the level changes in a ramp form with a lapse of time. Other units than the DAC 151 may be used as a unit for generating a reference voltage Vref of a ramp waveform.

The DAC 151 generates a reference voltage Vref having a ramp waveform based on a clock CK supplied from the timing control circuit 18 under the control by a control signal CS1 supplied from the timing control circuit 18 and supplies the reference voltage Vref to the ADCs 23-1 to 23-m of the column processing unit 14.

Now, a specific configuration of the ADCs 23-1 to 23-m featured by the present invention is described.

Each of the ADCs 23-1 to 23-m is capable of selectively performing AD conversion according to each operation mode: a normal-frame-rate mode in a progressive scanning for reading entire information of all of the unit pixels 11; and a high-frame-rate mode where the exposure time of the unit pixels 11 is set to 1/N of the normal-frame-rate mode and the frame rate is increased by N times (e.g., twice). The operation mode is switched under control of control signals CS2 and CS3 supplied from the timing control circuit 18. Instructing information for switching between the normal-frame-rate mode and the high-frame-rate mode is supplied from an external system controller (not shown) to the timing control circuit 18.

Since the ADCs 23-1 to 23-m have the same configuration, the configuration of the ADC 23-m will be described. The ADC 23-m includes a comparator 31, an up/down counter serving as a counting unit (referred to as U/D CNT in FIG. 1) 32, a transfer switch 33, and a memory device 34.

The comparator 31 compares the signal voltage Vx of the column signal line 22-m according to signals output from the unit pixels 11 in the m-th column of the pixel array unit 12 with the reference voltage Vref of a ramp waveform supplied from the reference-voltage supplying unit 15. For example, when the reference voltage Vref is higher than the signal voltage Vx, the output Vco is in a "H" level. When the reference voltage Vref is equal to or lower than the signal voltage Vx, the output Vco is in a "L" level.

The up/down counter 32 is an asynchronous counter. The timing control circuit 18 supplies a clock CK to the up/down counter 32 and the DAC 151 at the same time under control by the control signal CS2, which is supplied from the timing control circuit 18. Accordingly, the up/down counter 32 performs up/down count in synchronization with the clock CK in order to measure comparison time from the start to the end of the comparing operation in the comparator 31.

Specifically, in the normal-frame-rate mode, when a signal is read from one of the unit pixels 11, the comparison time of the first reading is measured by performing down count at the first reading operation, and the comparison time of the second reading is measured by performing up count at the second reading operation.

On the other hand, in the high-frame-rate mode, a count result on the unit pixel 11 in a row is held as is. Then, after the process goes onto the unit pixel 11 in the next row, down count is performed on the previous count result at the first reading operation so as to measure the comparison time at the first reading operation, and up count is performed at the second reading operation so as to measure the comparison time at the second reading operation.

The transfer switch 33 is turned on (closed) when the count operation of the up/down counter 32 on the unit pixel 11 of a row has been completed under control by the control signal CS3 supplied from the timing control circuit 18, and transfers the count result of the up/down counter 32 to the memory device 34 in the normal-frame-rate mode.

On the other hand, in a high-frame-rate mode where N=2, the transfer switch 33 is kept in an off-state (open) when the count operation of the up/down counter 32 on the unit pixel 11 of a row is completed. Then, after the count operation of the up/down counter 32 on the unit pixel 11 of the next row has been completed, the transfer switch 33 is turned on and transfers the count result of the vertical two pixels in the up/down counter 32 to the memory device 34.

In this way, analog signals supplied from the unit pixels 11 of the pixel array unit 12 through the column signal lines 22-1 to 22-m are converted to N-bit digital signals by the respective comparators 31 and the up/down counters 32 of the ADCs 23 (23-1 to 23-m), and the digital signals are stored in the memory devices 34 (34-1 to 34-m).

The column scanning circuit 16 includes a shift register or the like and controls a column address and column scanning of the ADCs 23-1 to 23-m in the column processing unit 14. Under the control by the column scanning circuit 16, the N-bit digital signals which have been AD converted by the ADCs 23-1 to 23-m are sequentially read to the horizontal output line 17 and are output there trough as image data.

Although not directly related to the present invention and thus not shown in the figure, a circuit or the like for performing various signal processes on the image data output through the horizontal output line 17 may be additionally provided.

In the CMOS image sensor 10 including the column-parallel ADCs according to this embodiment, the count result generated by the up/down counter 32 can be selectively transferred to the memory device 34 via the transfer switch 33. Therefore, the count operation by the up/down counter 32 and the operation of reading the counter result from the up/down counter 32 to the horizontal output line 17 can be controlled independently from each other.

Figure 2:
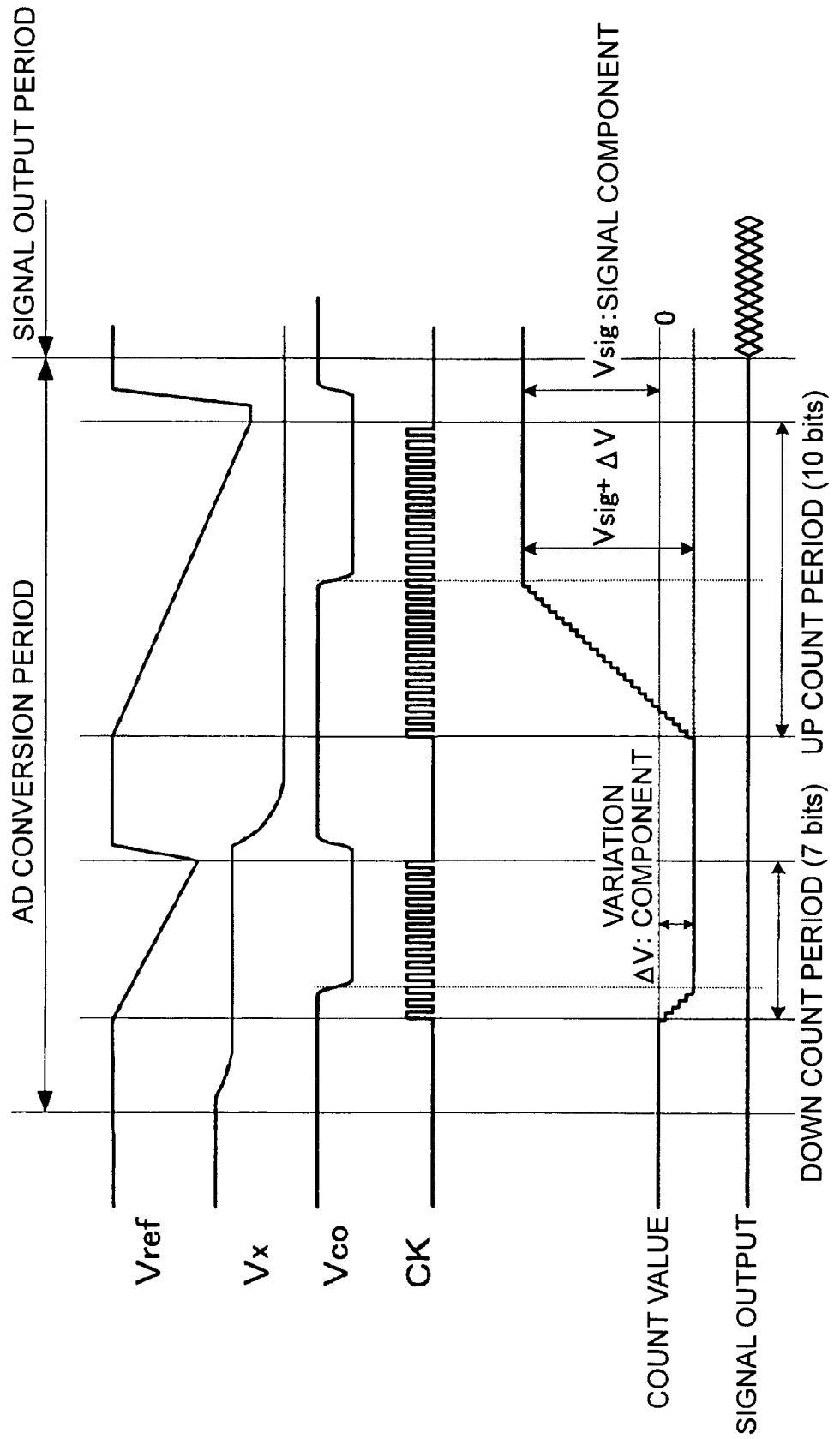
FIG. 2 is a timing chart illustrating the operation of the CMOS image sensor according to the first embodiment.

Next, the operation of the CMOS image sensor 10 having the above-described configuration according to the first embodiment will be described with reference to the timing chart shown in FIG. 2.

Herein, a specific operation of the unit pixels 11 is not described. As is well known, a reset operation and a transfer operation are performed in the unit pixels 11. In the reset operation, the potential of the FD unit reset to a predetermined potential is output as a reset component from the respective unit pixels 11 to the column signal lines 22-1 to 22-m. In the transfer operation, the potential of the FD unit at the time when charge generated by photoelectric conversion is transferred from the photoelectric transducer is output as a signal component from the respective unit pixels 11 to the column signal lines 22-1 to 22-m.

A row i is selected in row scanning by the row scanning circuit 13. After a first reading operation from the unit pixels 11 in the selected row i to the column signal lines 22-1 to 22-m has become stable, the reference voltage Vref of a ramp waveform is supplied from the DAC 151 to the respective comparators 31 of the ADCs 23-1 to 23-m, whereby the comparators 31 compare the signal voltages Vx of the column signal lines 22-1 to 22-m with the reference voltage Vref.

At the same time when the reference voltage Vref is supplied to each of the comparators 31, a clock CK is supplied from the timing control circuit 18 to each of the up/down counters 32, so that the up/down counter 32 measures the comparison time in the comparator 31 at the first reading operation by a down count operation. When the reference voltage Vref and the signal voltage Vx of the respective column signal lines 22-1 to 22-m become equal to each other, the output Vco of the comparator 31 is reversed from a "H" level to a "L" level. In response to the reversed polarity of the output Vco of the comparator 31, the up/down counter 32 stops the down count operation and holds a count value corresponding to the first comparing period in the comparator 31.

As described above, a reset component ΔV of the unit pixels 11 is read in the first reading operation. The reset component ΔV includes fixed-pattern noise which varies in each pixel unit 11 as an offset. However, since the variation of the reset component ΔV is generally small and the reset level is common in all the pixels, the signal voltages Vx of the column signal lines 22-1 to 22-m are approximately known. Therefore, at the first operation of reading the reset component ΔV, the comparing period can be shortened by adjusting the reference voltage Vref. In this embodiment, the reset component ΔV is compared in a count period of 7 bits (128 clocks).

In the second reading operation, a signal component Vsig according to the amount of incident light of each unit pixel 11 is read in addition to the reset component ΔV in the same manner as in the first reading operation. That is, after the second reading operation from the unit pixels 11 in the selected row i to the column signal lines 22-1 to 22-m has become stable, the reference voltage Vref is supplied from the DAC 151 to the respective comparators 31 of the ADCs 23-1 to 23-m. Accordingly, the respective comparators 31 compare the signal voltages Vx of the column signal lines 22-1 to 22-m with the reference voltage Vref, and at the same time, the time of the second comparison in the respective comparators 31 is measured by the corresponding up/down counters 32 by an up count operation unlike in the first operation.

In this way, each of the up/down counters 32 performs a down count operation at the first time and an up count operation at the second time. Accordingly, subtraction of (second comparing period)−(first comparing period) is automatically performed in the up/down counter 32. Then, the polarity of the output Vco of the comparator 31 is reversed when the reference voltage Vref and the signal voltage Vx of the respective column signal lines 22-1 to 22-m become equal to each other, and the count operation of the up/down counter 32 is stopped in response to the reversed polarity. As a result, a count value according to the subtraction result of (second comparing period)−(first comparing period) is held in the up/down counter 32. (Second comparing period)−(first comparing period)=(signal component vsig+reset component ΔV+offset component of ADC 23)−(reset component ΔV+offset component of ADC 23)=(signal component Vsig). By performing the two reading operations and subtraction by the up/down counters 32, the reset component ΔV including variations in the unit pixels 11 and an offset component of each of the ADCs 23 (23-1 to 23-m) can be removed. Accordingly, only a signal component Vsig according to the amount of incident light of each unit pixel 11 can be extracted. Herein, the reset component ΔV including variations in the respective unit pixels 11 is removed by a so-called CDS (correlated double sampling) process.

In the second reading operation, a signal component Vsig according to the amount of incident light is read, and thus the reference voltage Vref must be significantly varied in order to judge the amount of light in a wide range. For this reason, in the CMOS image sensor 10 according to this embodiment, comparison is performed in a count period of 10 bits (1024 clocks) when the signal component Vsig is read. In this case, the number of comparison bits is different in the first and second time. However, by making the inclination of the ramp waveform of the reference voltage Vref the same in the first and second time, the accuracy of AD conversion can be made equal. Accordingly, a correct subtraction result can be obtained from a subtraction process (second comparing period)−(first comparing period) by the up/down counter 32.

After the above-described series of AD converting operations, a digital value of N bits is held in each of the up/down counters 32. Then, the digital values (digital signals) of N bits which have been AD converted by the respective ADCs 23-1 to 23-m of the column processing unit 14 are sequentially output to the outside through the horizontal output line 17 of a width of N bits by column scanning by the column scanning circuit 16. Then, the same operation is sequentially performed for the respective rows, so that a two-dimensional image is generated.

In the CMOS image sensor 10 including the column-parallel ADCs according to this embodiment, each of the ADCs 23-1 to 23-m includes the memory device 34. With this configuration, AD converted digital values of the unit pixels 11 in the i-th row can be transferred to the corresponding memory devices 34 and output to the outside through the horizontal output line 17, while performing in parallel a reading operation and an up/down count operation on the unit pixels 11 in the i+1-th row.

Figure 3:
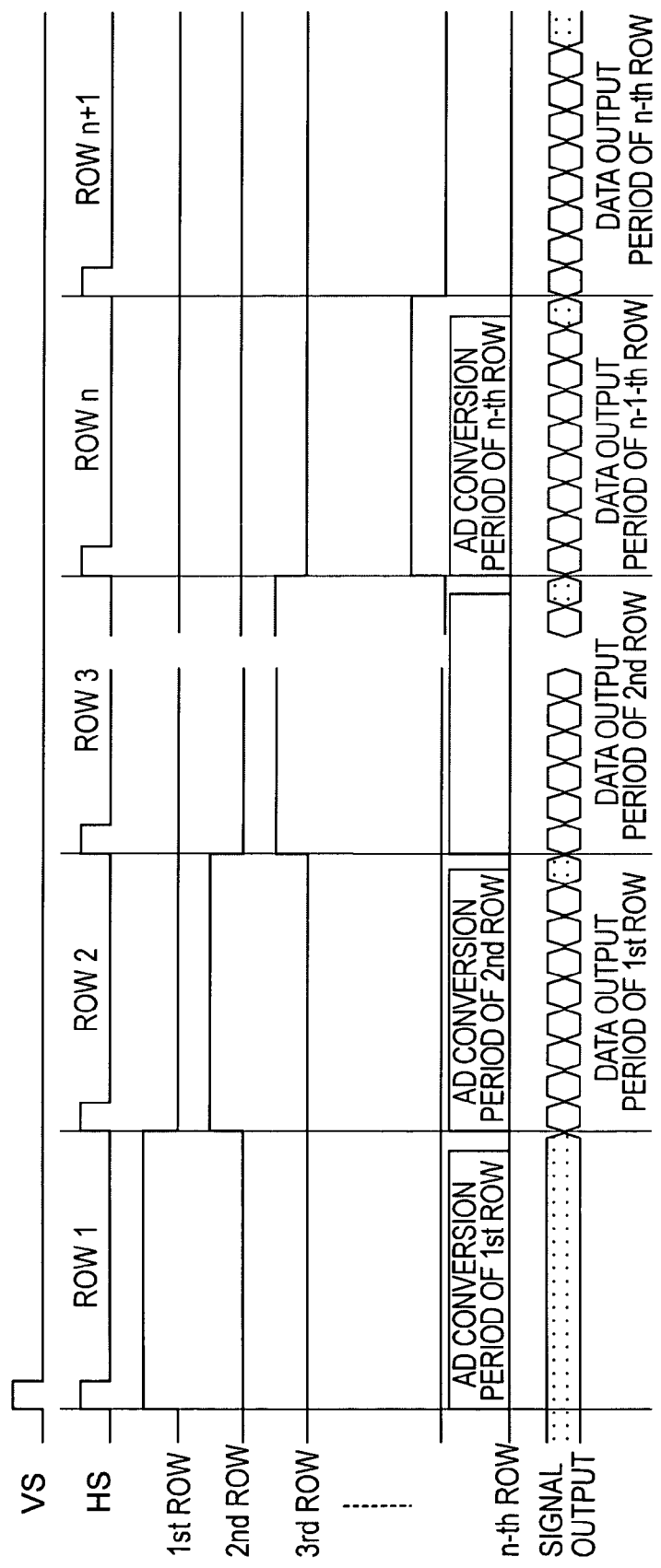
FIG. 3 is a timing chart illustrating the operation of performing AD conversion and reading in parallel in the CMOS image sensor according to the first embodiment.

Next, AD conversion and a reading operation performed in parallel will be described with reference to the timing chart shown in FIG. 3. In FIG. 3, VS denotes a vertical synchronizing signal indicating one frame period and HS denotes a horizontal synchronizing signal indicating one horizontal scanning period.

In the operation shown in FIG. 3, after a count value has been transferred from the up/down counter 32 to the memory device 34, the up/down counter 32 must be reset before starting a count operation in the up/down counter 32. If an up/down count operation for the i+1-th row is performed without resetting the up/down counter 32, the AD conversion result of the previous i-th row is set to the initial value of the up/down counter 32, and thus the sum of the i-th row and the i+1-th row is held in the up/down counter 32 by repeating the same operation.

Next, an adding operation in each of the up/down counters 32 in the CMOS image sensor 10 including the column-parallel ADCs according to this embodiment will be described with reference to the timing chart shown in FIG. 4. The adding operation in the up/down counter 32 is performed in an operation in a high-frame-rate mode, where the exposure time of the unit pixels 11 is reduced to ½ from the normal-frame-rate mode, where pixel information is read from all the unit pixels 11 of the pixel array unit 12.

The up/down counter 32 is capable of holding a digital value of N bits therein after reading the digital value. In this embodiment, by using the data holding characteristic of the up/down counter 32, AD-converted values of the unit pixels 11 in a plurality of rows (i-th row and i+1-th row in this embodiment) are added in the up/down counter 32.

As described above, when a signal of each unit pixel 11 in the i-th row is to be read, a digital value of (second comparing time)−(first comparing time)=(Vsig 1+ΔV1)−ΔV1=Vsig 1 is held in the corresponding up/down counter 32 when the signal component in the i-th row is Vsig 1 and the reset component ΔV of the i-th row is ΔV1. After the AD conversion period of the i-th row, the process proceeds to an operation of reading a signal of each unit pixel 11 in the i+1-th row without resetting the up/down counter 32, and the same reading operation as for the i-th row is performed.

When the signal component of the i+1-th row is Vsig 2 and when the reset component of the i+1-th row is ΔV2, the digital value held in the up/down counter 32 after AD conversion of the i+1-th row is Vsig 1+(Vsig 2+ΔV2)−ΔV2=Vsig 1+Vsig 2. This digital value is in the up/down counter 32 is transferred to the memory device 34 through the transfer switch 33 and is output to the outside through the horizontal output line 17. Accordingly, the sum Vsig 1+Vsig 2 of the signal components of the unit pixels 11 in the i-th row and the i+1-th row can be output.

By repeating the above-described operation, an image in which the pixel information is thinned to ½ in the vertical direction (column direction on the sensor surface) can be obtained. As a result, the frame rate can be increased by twice compared to the normal-frame-rate mode, where information of all the pixels is read.

As described above, in the CMOS image sensor 10 including the column-parallel ADCs according to the first embodiment, analog signals output from the unit pixels 11 through the column signal lines 22-1 to 22-m are converted to digital values by the ADCs 23-1 to 23-m provided for the respective columns. Then, among the digital values, the values of a plurality of unit pixels 11 (e.g., each two unit pixels 11) in the vertical direction (column direction) are added and read. Accordingly, the following function and advantages can be obtained.

In terms of the number of pieces of read pixel information, the above-described operation is equivalent to interlaced reading (skip reading) of ½ in the vertical direction. However, pixel information is added between two pixels in the vertical direction, and thus the amount of one piece of pixel information doubles. Therefore, even when the exposure time of the unit pixels 11 is reduced to ½ in order to double the frame rate, the amount of each piece of pixel information doubles by adding digital values of the unit pixels of two rows at AD conversion, so that the sensitivity is not degraded compared to the normal-frame-rate mode.

That is, even if the exposure time of the unit pixels 11 is shortened, the amount of each piece of pixel information does not decrease, so that the sensitivity is not degraded and a higher frame rate can be realized. Further, each of the ADCs 23-1 to 23-m includes the up/down counter 32, which performs an adding operation. With this configuration, a highly-accurate adding operation can be realized without using a memory device outside the chip 19 or using an additional circuit as column-parallel ADCs.

Although the adding operation is performed by using the up/down counter 32 in the first embodiment, a counter may be used instead of the up/down counter 32 for a simple adding operation. However, the up/down counter 32 is advantageous because an adding operation can be performed while performing digital CDS processing of removing a reset component ΔV from the signal component Vsig of the unit pixel 11. Also, the processing may be realized by using an operating unit for performing a digital operation.

The pixels are added between two rows in the first embodiment, but the pixels may be added among three or more rows. At this time, when the number of added rows is M, the amount of image data can be compressed to 1/M.

Figure 5:
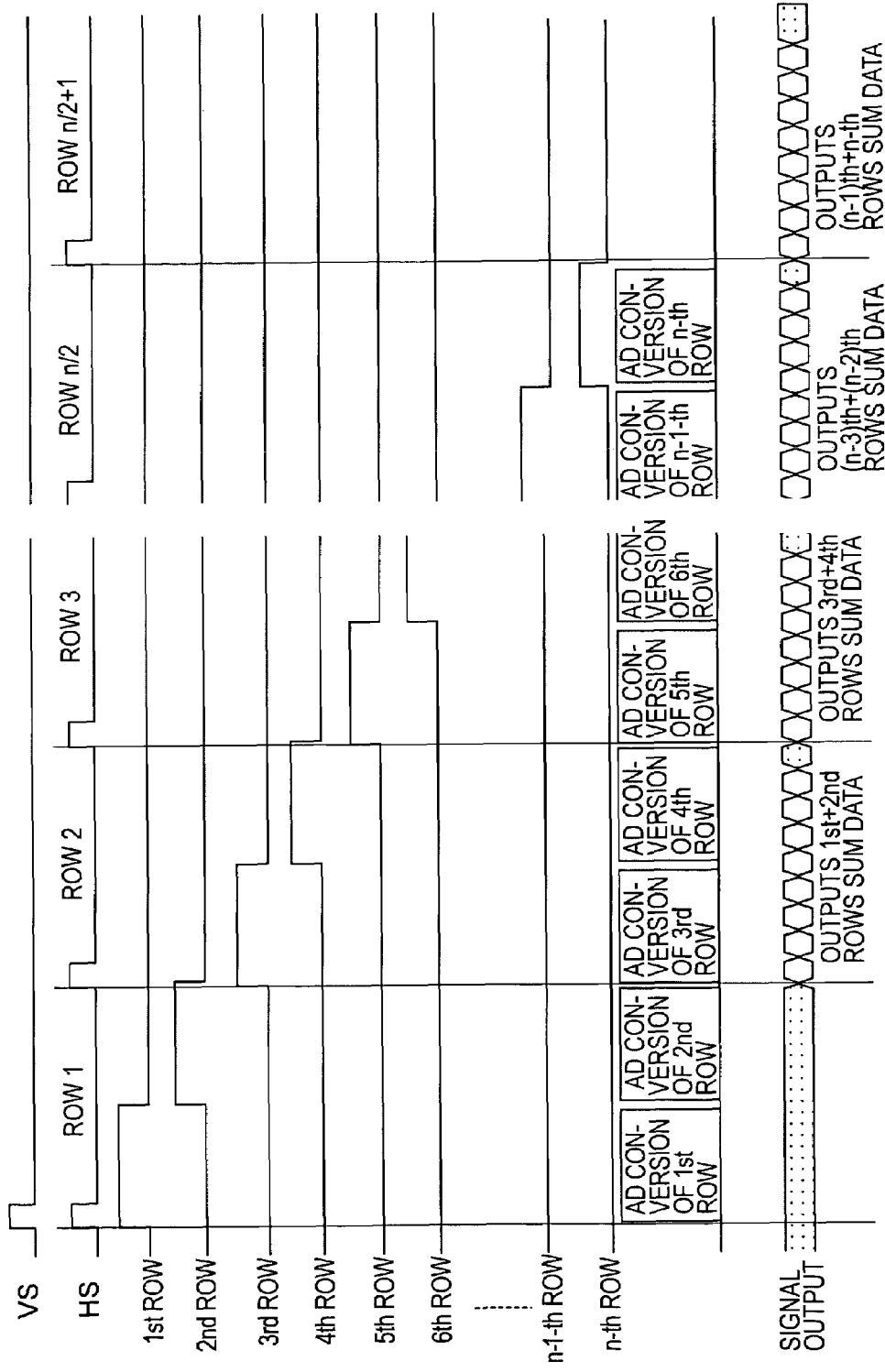
FIG. 5 is a timing chart illustrating the operation of performing AD conversion and reading in parallel in the CMOS image sensor according to the first embodiment.

In the first embodiment, the frame rate is increased by M times by compressing the amount of image data to 1/M and changing the data output rate. Alternatively, the frame rate may be increased by M times without changing the data output rate by shortening the AD conversion period to 1/M. That is, the amount of data may be compressed by adding pixels of rows by using the up/down counters 32 as in the CMOS image sensor 10 according to the first embodiment, but alternatively, as shown in the timing chart in FIG. 5, the frame rate may be doubled without changing the data output rate by shortening the AD conversion period to 1/M, for example, ½.

Figure 4:
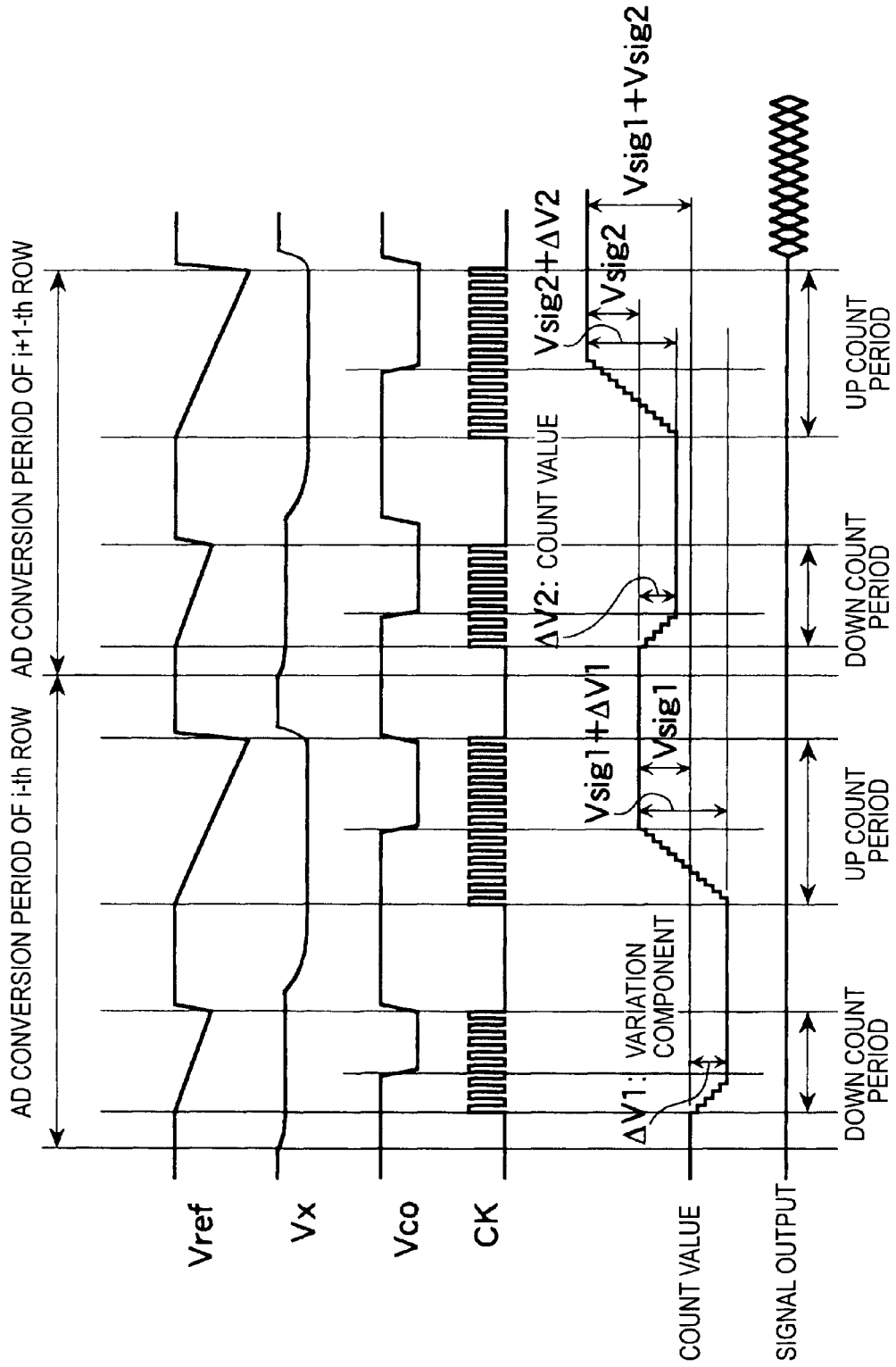
FIG. 4 is a timing chart illustrating the operation of the CMOS image sensor according to the first embodiment.

When the AD conversion period can not be shortened while maintaining the bit accuracy of AD conversion, the digital count value of up-count of the up/down counter 32 is restricted up to N-1 bits in the timing chart shown in FIG. 4. In a case of 10-bit count, for example, comparison is performed in a 1024-clock period. This period is reduced to 9-bit count, that is, a 512-clock period. In this case, the rate of time change of the reference voltage Vref (ramp waveform) generated by the DAC 151 is the same. This means that the bit accuracy of AD conversion does not change.

When the frame rate doubles, the accumulation time of each unit pixel is reduced to ½ and the amplitude of a signal is also reduced to ½; so that the S/N decreases. In an adding operation in the CMOS image sensor 10 according to the first embodiment, the digital value generated by addition of pixels in two rows is Vsig 1+Vsig 2. Even when the frame rate doubles, the amplitude of the signal is (Vsig 1+Vsig 2)/2=Vsig 1. In this way, the change of signal amplitude is small and thus the S/N is not degraded.

Likewise, when the AD conversion period is shortened to 1/M by adding M rows, the frame rate increases by M times. At this time, the frame rate can be increased without degrading the S/N by decreasing the bit accuracy of AD conversion of N bits to N−M bits.

Second Embodiment

Figure 6:
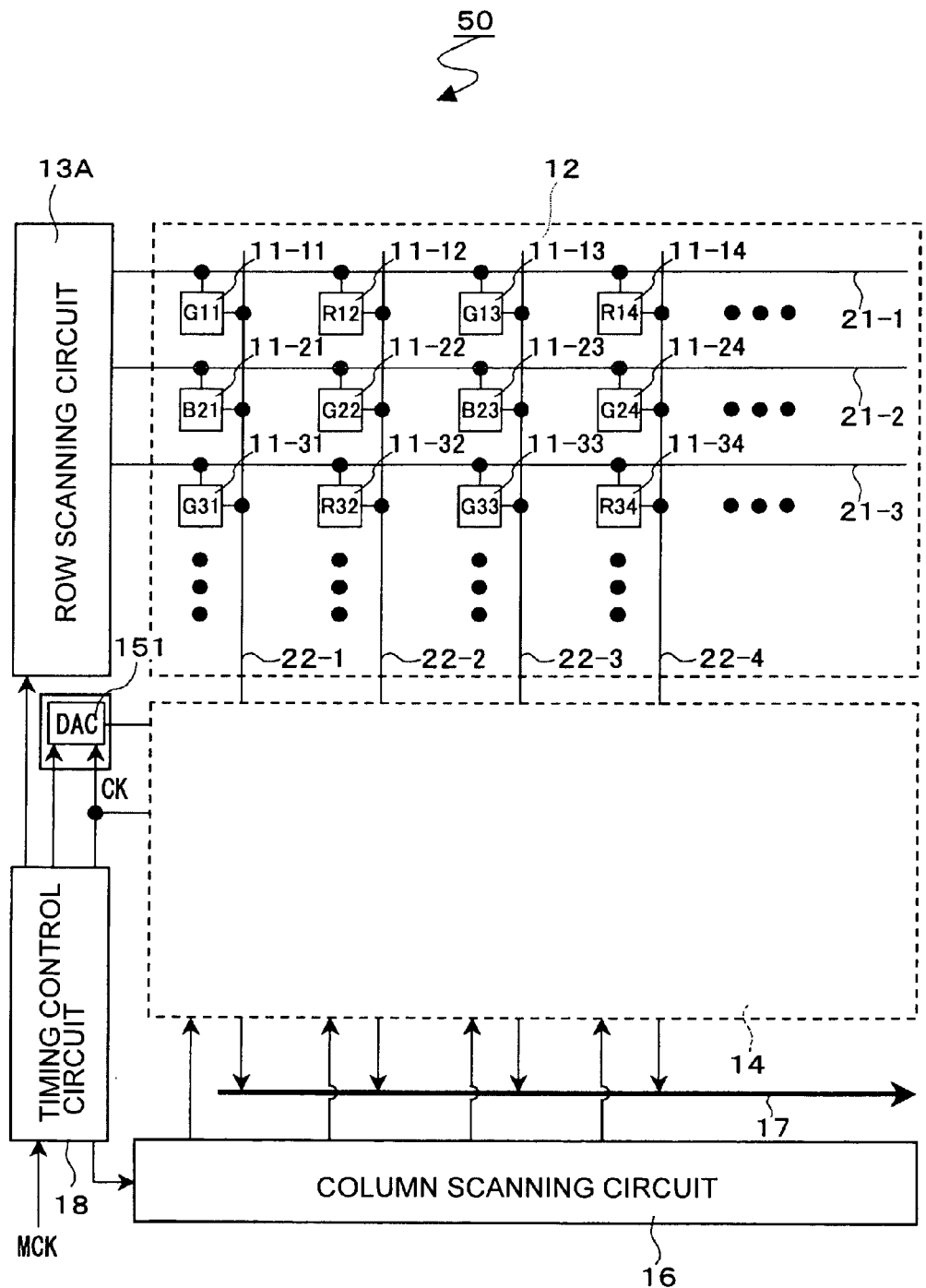
FIG. 6 is a block diagram showing the configuration of a CMOS image sensor including column-parallel ADCs according to a second embodiment of the present invention.
Figure 7:
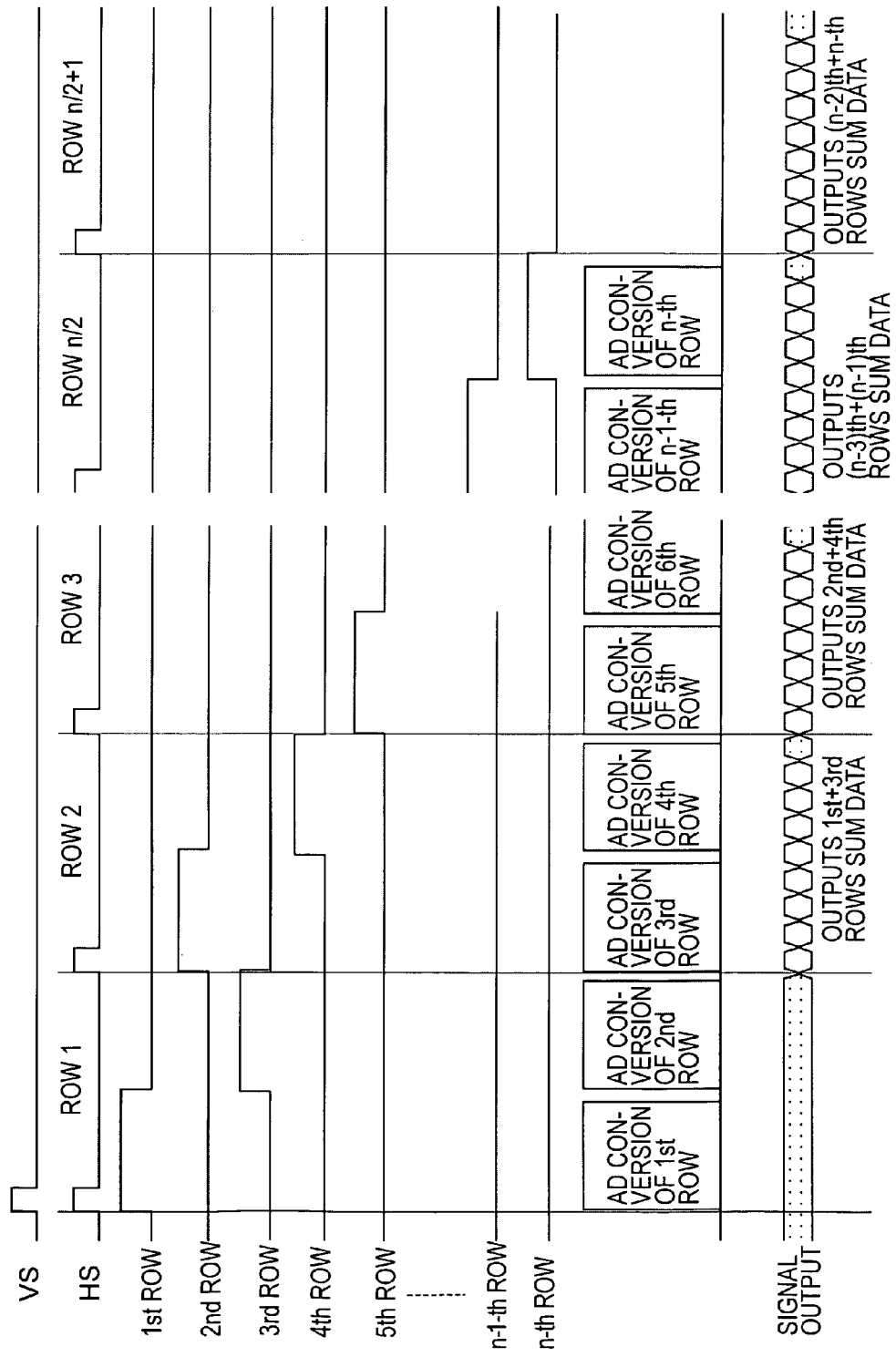
FIG. 7 is a timing chart illustrating the operation of the CMOS image sensor according to the second embodiment.

FIG. 6 is a block diagram showing the configuration of a CMOS image sensor 50 including column-parallel ADCs according to a second embodiment of the present invention. FIG. 7 shows a timing chart for illustrating the operation of the CMOS image sensor 50 according to this embodiment.

The configuration of the CMOS image sensor 50 including column-parallel ADCs according to this embodiment is basically the same as that of the CMOS image sensor 10 including column-parallel ADCs according to the first embodiment shown in FIG. 1. The difference between them is that a row scanning circuit 13A includes an address decoder capable of selecting arbitrary row control lines 21-i (21-1 to 21-n). The row scanning circuit 13A including the address decoder is capable of sequentially selecting the row control lines 21-1 to 21-n in the order of first row, third row, second row, fourth row, . . . , as shown in FIG. 7, for example.

In this row scanning, when an adding operation is performed in units of two rows as in the CMOS image sensor 10 according to the first embodiment, the pixel 11-11 in the first row control line 21-1 and the pixel 11-31 in the third row control line 21-3 are added, and the pixel 11-12 in the first row control line 21-1 and the pixel 11-32 in the third row control line 21-3 are added. In this way, the pixels 11-11, 11-12, 11-13, . . . in the first row can be added to the pixels 11-31, 11-32, 11-33 . . . in the third row, respectively.

Likewise, the pixel 11-21 in the second row control line 21-2 and the pixel 11-41 in the fourth row control line 21-4 are added, and the pixel 11-22 in the second row control line 21-2 and the pixel 11-42 in the fourth row control line 21-4 are added. In this way, the pixels 11-21, 11-22, 11-23 . . . in the second row can be added to the pixels 11-41, 11-42, and 11-43 . . . in the fourth row, respectively. That is, pixels can be added between odd-numbered rows and between even-numbered rows.

Herein, assume that color filters are arranged in a Bayer pattern on the pixel array unit 12 as shown in FIG. 6. In this case, G (green) and R (red) color filters or B (blue) and G color filters are arranged in each row.

In the CMOS image sensor including the Bayer-patterned color filters, if the row control lines 21-1 to 21-n are sequentially selected as in the CMOS sensor 10 according to the first embodiment, pixels of different color-filter elements are added, and thus different colors are mixed. In contrast to this, in the CMOS image sensor 50 according to this embodiment, pixels can be added between odd-numbered rows and between even-numbered rows so that pixels of the same color can be added. Therefore, color mixture due to addition of pixels does not occur.

Third Embodiment

Figure 8:
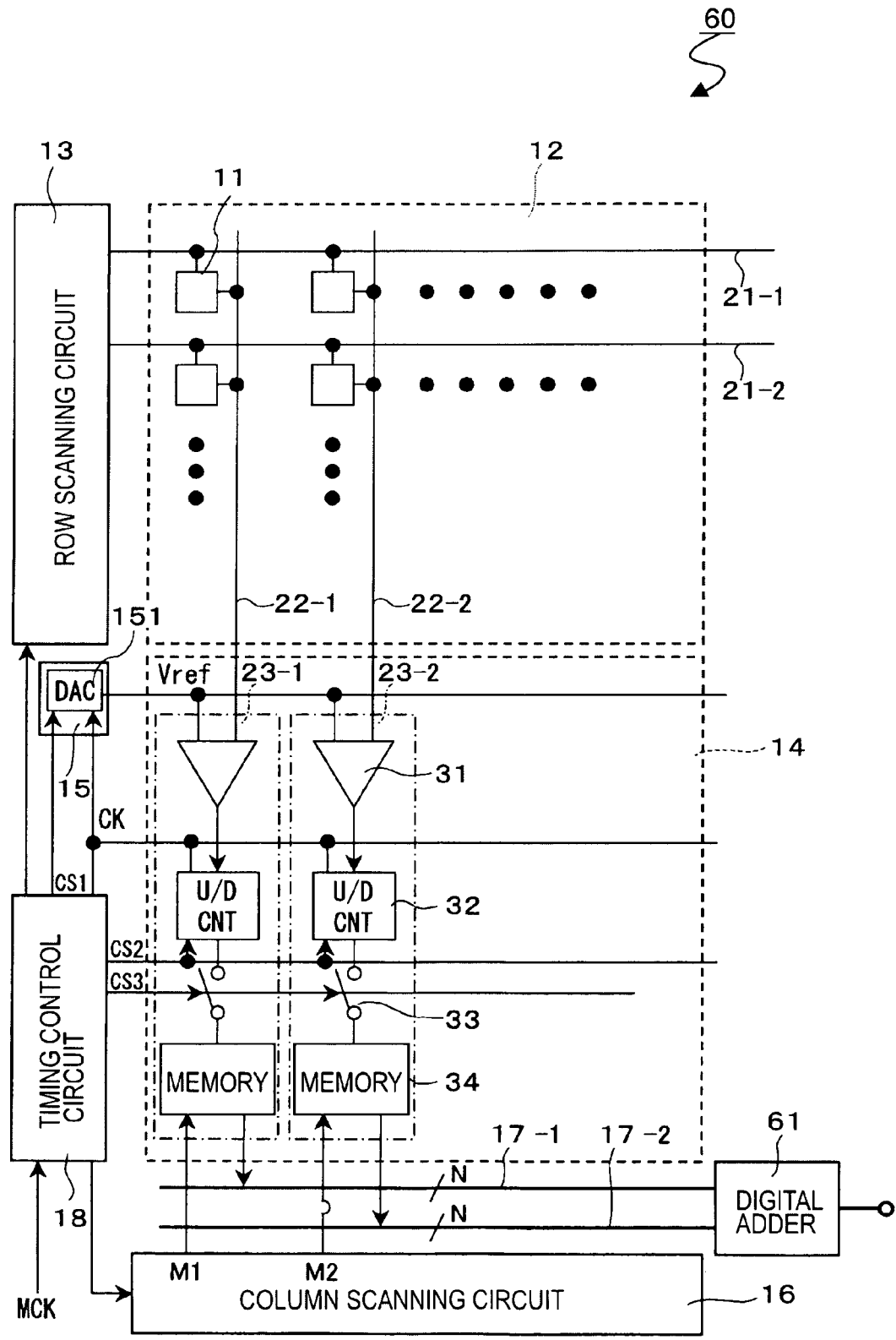
FIG. 8 is a block diagram showing the configuration of a CMOS image sensor including column-parallel ADCs according to a third embodiment of the present invention.

FIG. 8 is a block diagram showing the configuration of a CMOS image sensor 60 including column-parallel ADCs according to a third embodiment of the present invention. In FIG. 8, parts which are the same as those in FIG. 1 are denoted by the same reference numerals.

The configuration of the CMOS image sensor 60 including column-parallel ADCs according to this embodiment is basically the same as that of the CMOS image sensor 10 including column-parallel ADCs according to the first embodiment shown in FIG. 1. The difference between them is as follows.

The output of each of the ADCs 23-1, 23-3, . . . , connected to the odd-numbered column signal lines 22-1, 22-3, . . . , is output through a horizontal output line 17-1 of an N-bit width. Likewise, the output of each of the ADCs 23-2, 23-4, . . . , connected to the even-numbered column signal lines 22-2, 22-4, . . . , is output through a horizontal output line 17-2 of an N-bit width. The digital signals of the odd-numbered rows output through the horizontal output line 17-1 and the digital signals of the even-numbered rows output through the horizontal output line 17-2 are added in a digital adder 61 of N bits.

In the CMOS image sensor 60 having the above-described configuration according to this embodiment, the count result generated by the up/down counter 32 is transferred to the memory device 34 and is held therein. With this configuration, a counting operation in the up/down counter 32 and an operation of reading a count result from the memory device 34 to the horizontal output line 17-1 or 17-2 can be controlled independently from each other. Therefore, count values of the even-numbered columns and odd-numbered columns can be read from the memory devices 34 and added in the digital adder 61 while performing a counting operation in each up/down counter 32. As a result, pixels can be added between two columns.

Furthermore, by combining the inter-column adding operation in the CMOS image sensor 60 according to this embodiment and the inter-row adding operation in the CMOS image sensor 10 according to the first embodiment, an adding operation of 2 rows and 2 columns can be realized.

Next, the operation of the CMOS image sensor 60 having the above-described configuration according to the third embodiment will be described with reference to the timing chart shown in FIG. 9.

An operation of reading signals from the unit pixels 11 of the pixel array unit 12 in units of rows and performing a count operation in the up/down counters 32 of the ADCs 23-1, 23-2, . . . , is the same as that in the CMOS image sensor 10 according to the first embodiment. An operation of adding digital count values of the x-th row (x is an arbitrary number of 1 to n−1) and the x+1-th row in the corresponding up/down counter 32 is the same as that in the CMOS image sensor 50 according to the second embodiment.

After the adding operation, the addition result is transferred to the memory device 34 in each column, and the addition results of the odd-numbered columns and the even-numbered columns are input to the digital adder 31 through the horizontal output lines 17-1 and 17-2, respectively. At this time, control signals M1, M2, M3, . . . , output from the column scanning circuit 16 are simultaneously output in pairs of M1 and M2, M3 and M4, . . . . Accordingly, the digital values (addition results) held in the memory devices 34 are simultaneously output to the horizontal output line 17-1 or 17-2 in units of two columns.

Figure 9:
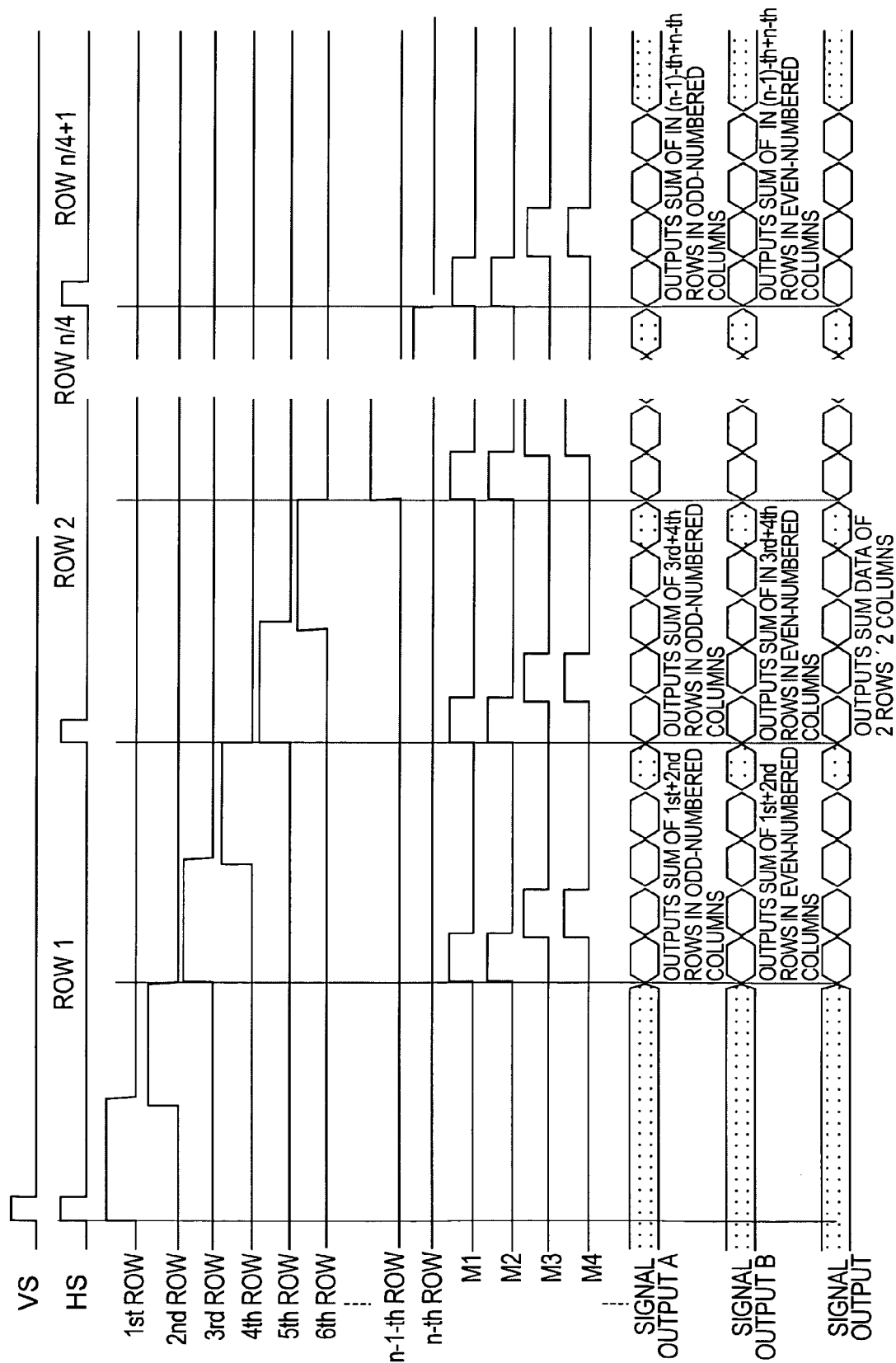
FIG. 9 is a timing chart illustrating the operation of the CMOS image sensor according to the third embodiment.

In the timing chart shown in FIG. 9, the addition result in the odd-numbered columns is output to signal output A and the addition result in the even-numbered columns is output to signal output B. Specifically, the addition result of the pixels 11-11 and 11-21 is output as a top signal of the signal output A and the addition result of the pixels 11-12 and 11-22 is output as a top signal of the signal output B. As a result, the addition result of the four pixels 11-11, 11-12, 11-21, and 11-22 is output as the top output of the digital adder 61.

As is clear from the above description, in the CMOS image sensor 60 according to this embodiment, by decreasing the bit accuracy of AD conversion and shortening the AD conversion period to ¼, the frame rate can be increased by four times while keeping the sensitivity constant as in the CMOS image sensor 50 according to the second embodiment.

Fourth Embodiment

Figure 10:
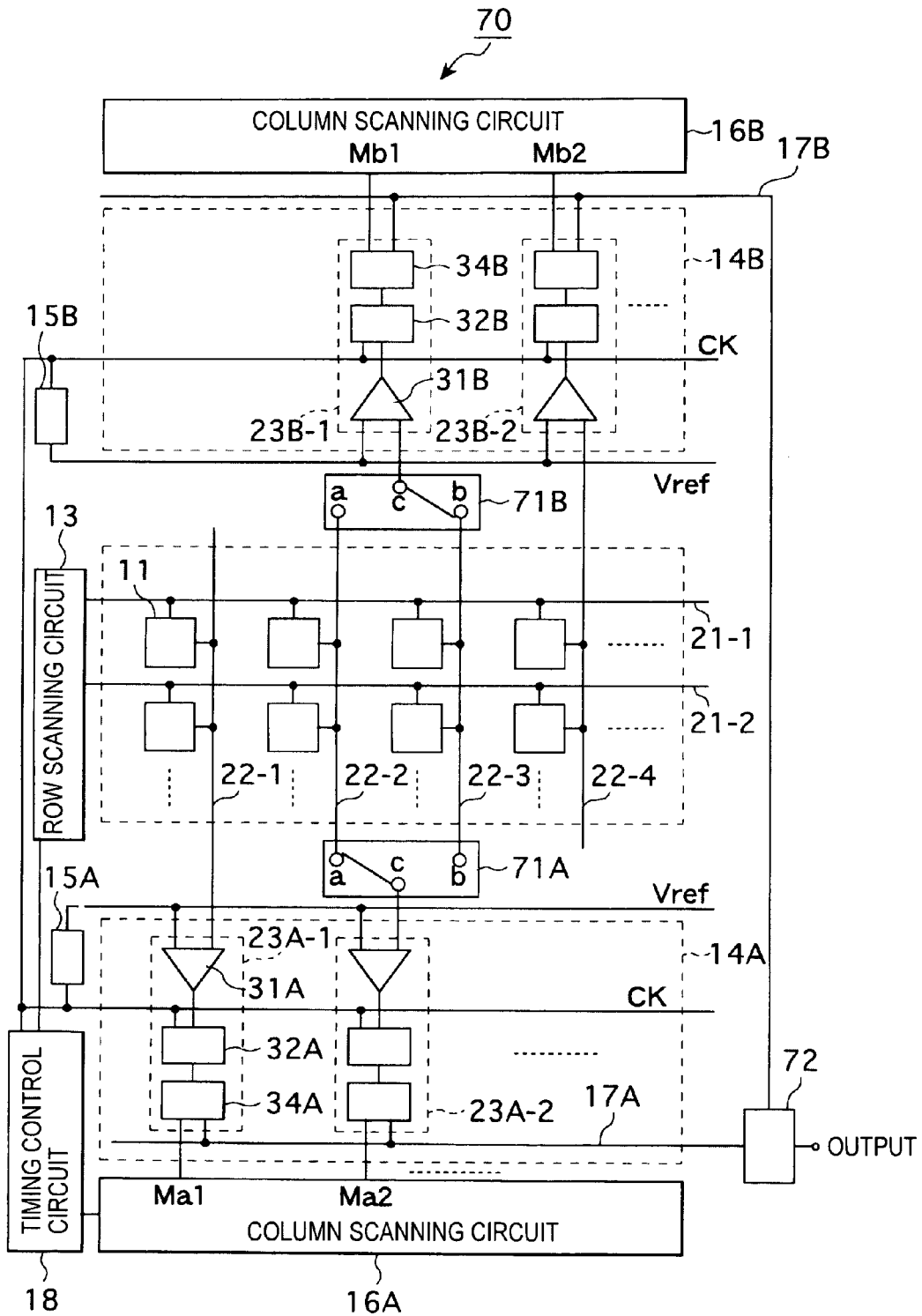
FIG. 10 is a block diagram showing the configuration of a CMOS image sensor including column-parallel ADCs according to a fourth embodiment of the present invention.

FIG. 10 is a block diagram showing the configuration of a CMOS image sensor 70 including column-parallel ADCs according to a fourth embodiment of the present invention. In the figure, parts which are the same as those in FIG. 1 are denoted by the same reference numerals.

In the above-described CMOS image sensors 10, 50, and 60 including column-parallel ADCs according to the first to third embodiments, the column processing unit 14, the reference-voltage supplying unit 15, the column scanning circuit 16, and the horizontal output line 17 (17-1 and 17-2) are provided on only one of the upper and lower sides (e.g., lower side) of the column direction of the pixel array unit 12.

In contrast to this configuration, in the CMOS image sensor 70 including column-parallel ADCs according to this embodiment, a pair of column processing units 14A and 14B, a pair of reference-voltage supplying units 15A and 15B, a pair of column scanning circuits 16A and 16B, and a pair of horizontal output lines 17A and 17B are disposed on both sides of the pixel array unit 12 in the column direction. Further, selecting switches 71A and 713 are disposed between the pixel array unit 12 and the column processing units 14A and 14B.

The pair of column processing units 14A and 14B, the pair of reference-voltage supplying units 15A and 15B, and the pair of column scanning circuits 16A and 16B have the entirely same configuration as that of the column processing unit 14, the reference-voltage supplying unit 15, and the column scanning circuit 16, respectively, of the CMOS image sensor 10 according to the first embodiment.

Each of the horizontal output lines 17A and 17B is a signal line of N bits, which transmits digital signals of N bits output from the column processing unit 14A or 14B to a digital adder 72 of N bits. The digital adder 72 adds the digital signals output from the column processing units 14A and 14B through the horizontal output lines 17A and 17B.

The selecting switches 71A and 71B operate in a complimentary manner so as to connect one of two adjoining column signal lines to the column processing unit 14A when the other column signal line is connected to the column processing unit 14B, and vice versa.

Specifically, in the selecting switches 71A and 71B, fixed contacts on one side (contacts a) are connected to both ends of the column signal line 22-2, the other fixed contacts b are connected to both ends of the column signal line 22-3, and movable contacts c are connected to an ADC 23A-2 and an ADC 23B-1, respectively. When the movable contact c of the selecting switch 71A is connected to the fixed contact a, the movable contact c of the selecting switch 71B is connected to the fixed contact b. When the movable contact c of the selecting switch 71A is connected to the fixed contact b, the movable contact c of the selecting switch 71B is connected to the fixed contact a.

In order to simplify the figure, only the selecting switches 71A and 71B connected between the column signal lines 22-2 and 22-3 are shown in FIG. 10. However, these selecting switches 71A and 71B are provided for every two columns in units of two adjoining column signal lines from the second column.

Figure 11:
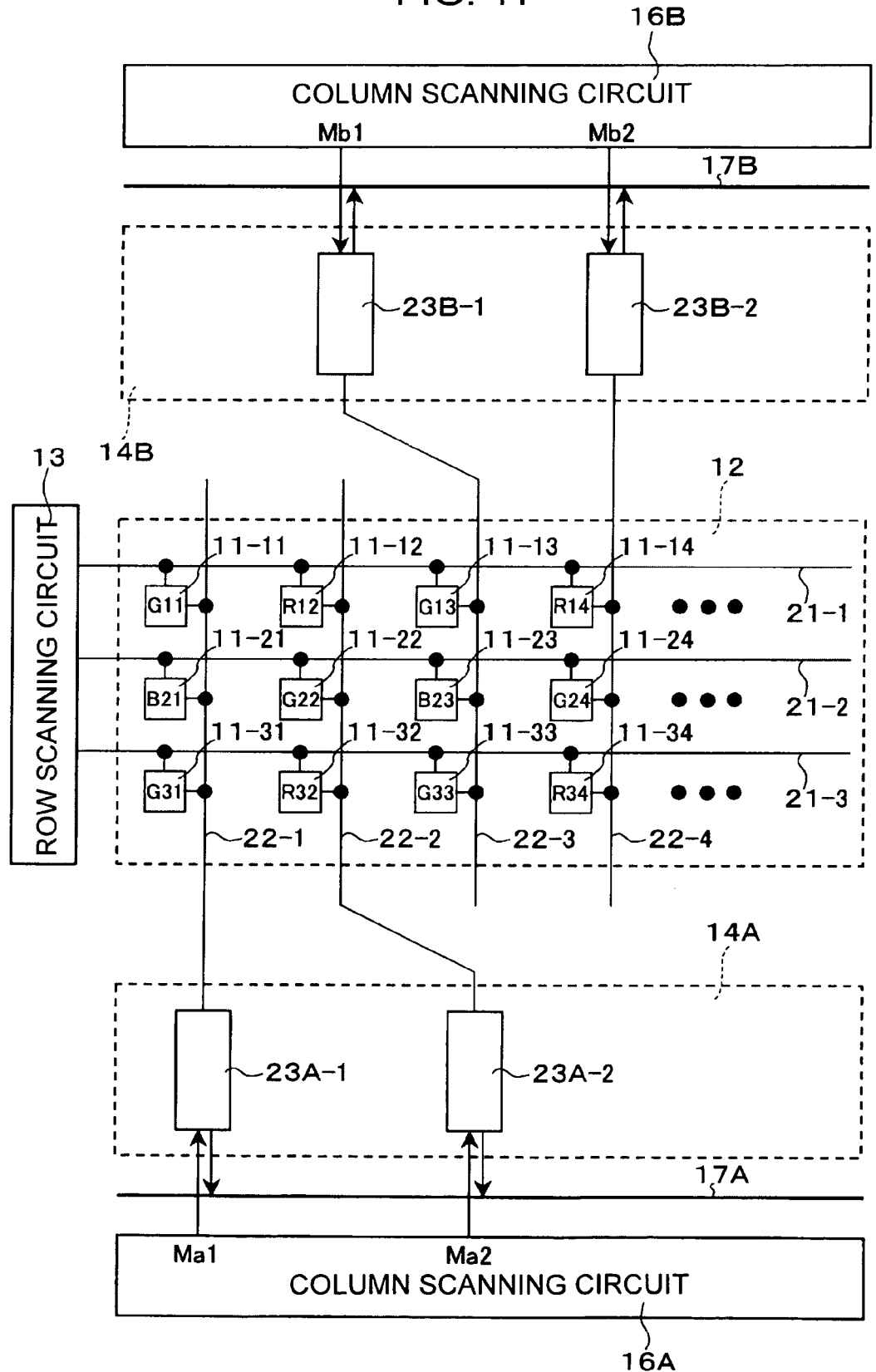
FIG. 11 is an equivalent circuit diagram (1) illustrating the operation of the CMOS image sensor according to the fourth embodiment.

In the CMOS image sensor 70 including the column-parallel ADCs according to this embodiment, when the movable contact c of the selecting switch 71A is connected to the fixed contact a and when the movable contact c of the selecting switch 71B is connected to the fixed contact b, analog signals of the pixels in the first and second columns, the fifth and sixth columns, . . . , are read into the column processing unit 14A, and analog signals of the pixels in the third and fourth columns, the seventh and eighth columns, . . . , are read into the column processing unit 14B. Then, the analog signals are converted to digital signals by respective comparators 31A and 31B and up/down counters 32A and 32B, and the digital signals are stored in the respective memory devices 34A and 34B. The equivalent circuit of this case is shown in FIG. 11.

Figure 12:
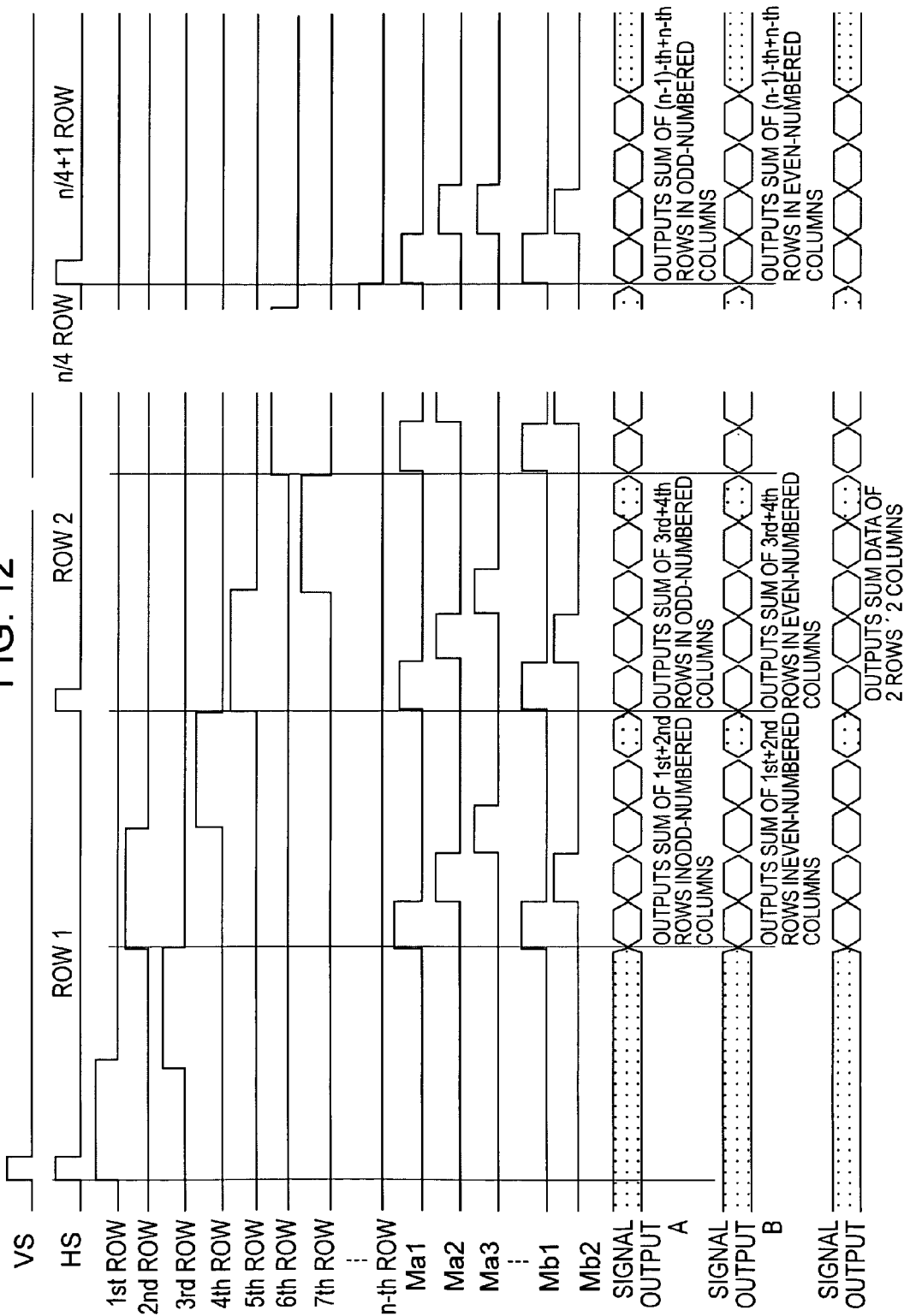
FIG. 12 is a timing chart illustrating the operation of the CMOS image sensor according to the fourth embodiment.

As shown in the timing chart shown in FIG. 12, control signals Ma1, Ma2, . . . , from the column scanning circuit 16A and control signals Mb1, Mb2, . . . , from the column scanning circuit 16B are sequentially output in the same timing, respectively. Then, the digital values of the pixels in the first and third columns stored in the memory devices 34A and 34B in the ADCs 23A-1 and 23B-1 are simultaneously read into the horizontal output lines 17A and 17B by the control signals Ma1 and Mb1, respectively. Then, the digital values of the pixels in the second and fourth columns stored in the memory devices 34A and 34B in the ADCs 23A-2 and 23B-2 are simultaneously read into the horizontal output lines 17A and 17B by the control signals Ma2 and Mb2, respectively. The same operation is sequentially performed thereafter.

As a result, the digital adder 72 adds digital values of the pixels of two odd-numbered columns and two even-numbered columns like this: digital values of the pixels in the first and third columns are added and digital values of the pixels in the second and fourth columns are added. In this way, by adding pixels between odd-numbered columns and between even-numbered columns, same colors can be added together when the color filters are arranged in a Bayer pattern as shown in FIG. 11. Therefore, mixture of different colors due to addition of pixels does not occur.

Furthermore, by combining the adding operation between two columns in the CMOS image sensor 70 according to this embodiment and the adding operation between two rows in the CMOS image sensor 50 according to the second embodiment, same colors can be added both between columns and between rows. Therefore, an adding operation of 2 rows and 2 columns can be realized without mixing different colors.

Further, the frame rate can be increased by four times while keeping the sensitivity constant.

Figure 13:
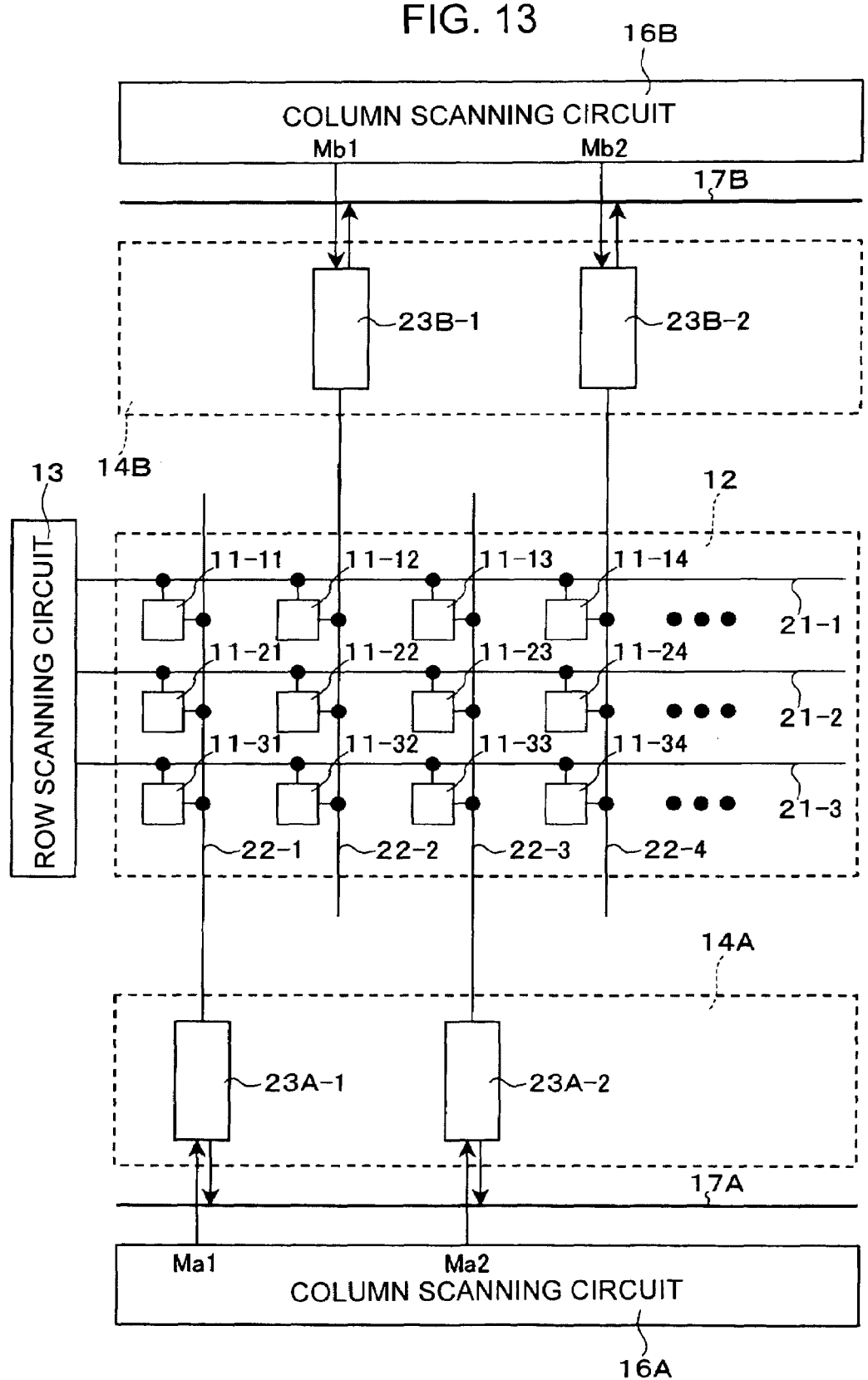
FIG. 13 is an equivalent circuit diagram (2) illustrating the operation of the CMOS image sensor according to the fourth embodiment.

On the other hand, in FIG. 10, when the movable contact c of the selecting switch 71A is connected to the fixed contact b and when the movable contact c of the selecting switch 71B is connected to the fixed contact a, analog signals of the pixels in the first and third columns, the fifth and seventh columns, . . . , are read into the column processing unit 14A, and analog signals of the pixels in the second and fourth columns, the sixth and eighth columns, . . . , are read into the column processing unit 14B. Then, the analog signals are converted to digital signals by the respective comparators 31A and 31B and the up/down counters 32A and 32B, and the digital signals are stored in the memory devices 34A and 34B. The equivalent circuit of this case is shown in FIG. 13.

The control signals Ma1, Ma2, . . . from the column scanning circuit 16A and the control signals Mb1, Mb2, . . . from the column scanning circuit 16B are sequentially output in the same timing, respectively. Therefore, the digital values of the pixels in the first and second columns stored in the memory devices 34A and 34B in the ADCs 23A-1 and 23B-1 are simultaneously read into the horizontal output lines 17A and 17B by the control signals Ma1 and Mb1, respectively. Then, the digital values of the pixels in the third and fourth columns stored in the memory devices 34A and 34B in the ADCs 23A-2 and 23B-2 are simultaneously read into the horizontal output lines 17A and 17B by the control signals Ma2 and Mb2, respectively. The same operation is sequentially performed thereafter.

As a result, the digital adder 72 adds digital values of the pixels in two adjoining (sequential) columns like this: digital values of the pixels in the first and second columns are added and digital values of the pixels in the third and fourth columns are added. Such addition of pixels between two adjoining columns can be applied to a three-plate image sensor in which color filters of the same color (only R/G/B) are provided on the same sensor.

Furthermore, by combining the adding operation between two columns in the CMOS image sensor 70 according to this embodiment and the adding operation between two rows in the CMOS image sensor 10 according to the first embodiment, an adding operation of 2 rows and 2 columns can be realized. Further, the frame rate can be increased by four times while keeping the sensitivity constant.

As described above, in the CMOS image sensor 70 according to this embodiment, the column processing units 14A and 14B are disposed on both sides of the pixel array unit 12, and the selecting switches 71A and 71B are provided between the pixel array unit 12 and the column processing units 14A and 14B. By using the function of the selecting switches 71A and 71B, the pair of columns to be added can be arbitrarily selected. With this circuit configuration, addition of digital values of pixels can be realized both in a single-plate image sensor having a Bayer pattern and a three-plate image sensor.

In this embodiment, the horizontal output lines 17A and 17B are provided corresponding to the pair of column processing units 14A and 14B. Alternatively, as in the third embodiment, each of the horizontal output lines 17A and 17B may comprise a plurality of lines (e.g., two lines), so that two control signals M are simultaneously output from each of the column scanning circuits 16A and 16B. Accordingly, addition of pixels can be realized between four columns.

Further, in this embodiment, the pair of column processing units, the pair of reference-voltage supplying units, the pair of column scanning circuits, the pair of horizontal output lines, and the pair of selecting switches are provided so as to add pixels in two columns. Alternatively, three or more column processing units, reference-voltage supplying units, column scanning circuits, horizontal output lines, and selecting switches may be provided. With this configuration, addition of pixels can be realized between three or more columns.

Fifth Embodiment

Figure 14:
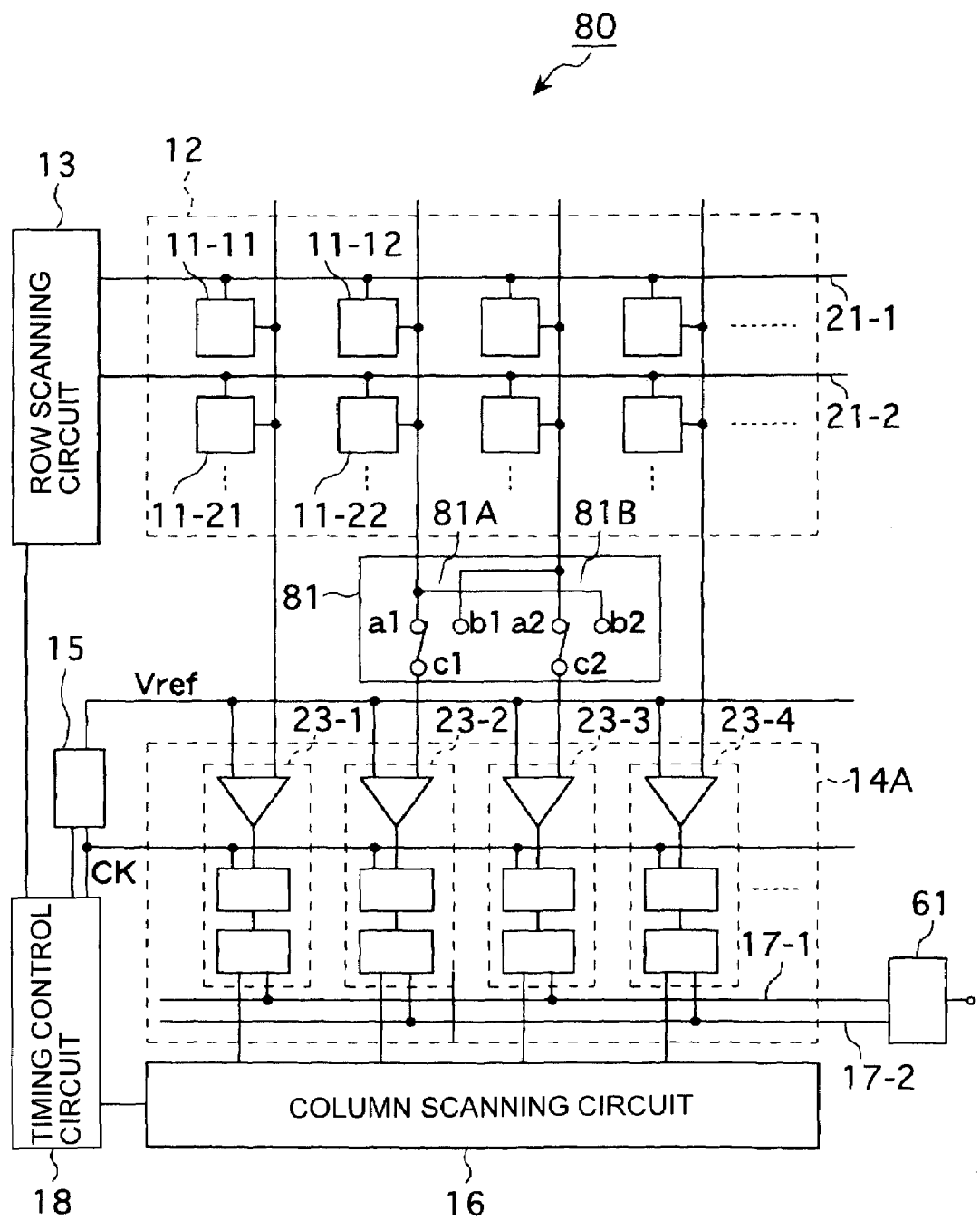
FIG. 14 is a block diagram showing the configuration of a CMOS image sensor including column-parallel ADCs according to a fifth embodiment of the present invention.
Figure 15:
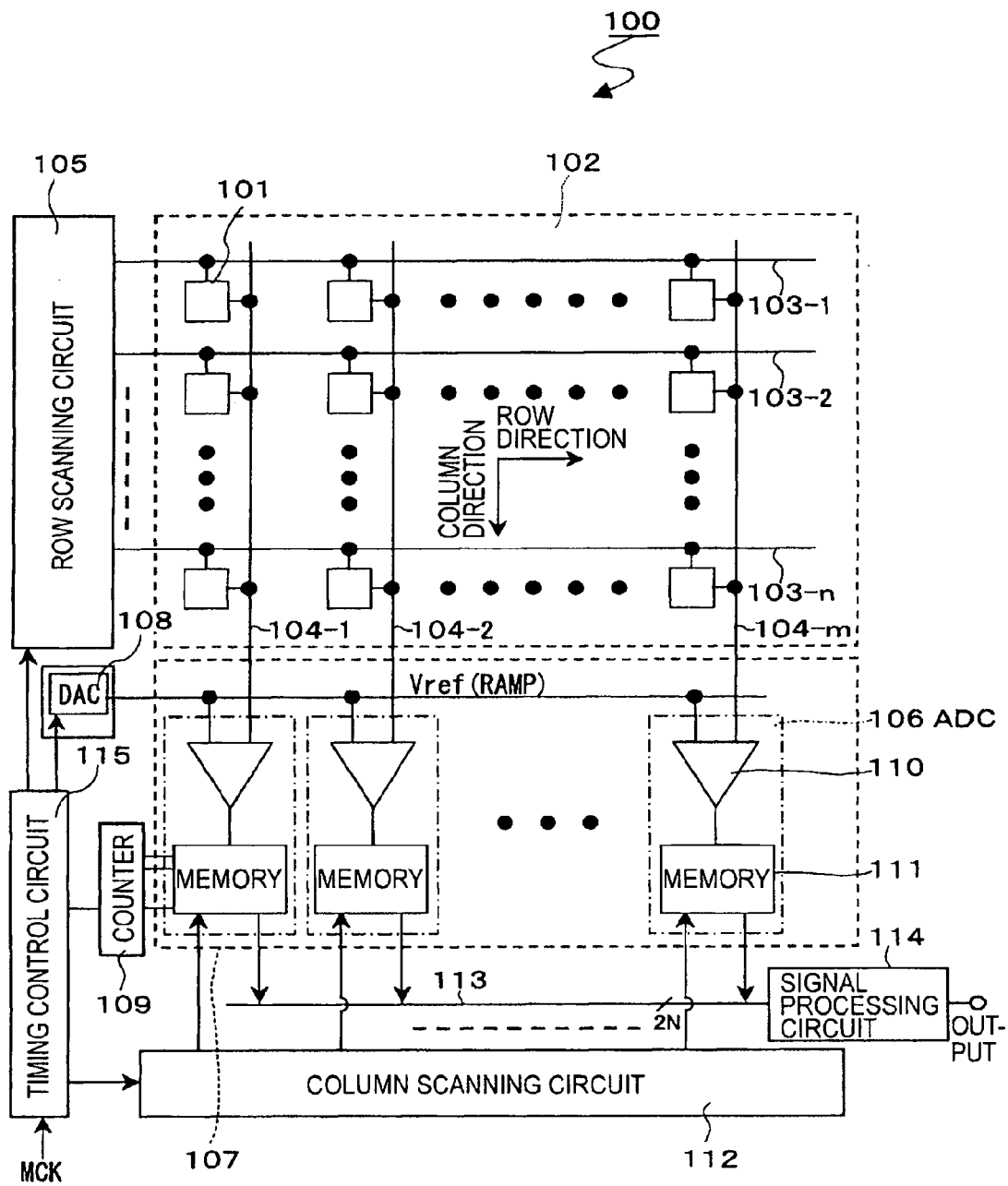
FIG. 15 is a block diagram showing the configuration of a CMOS image sensor including column-parallel ADCs according to a known art.
Figure 16:
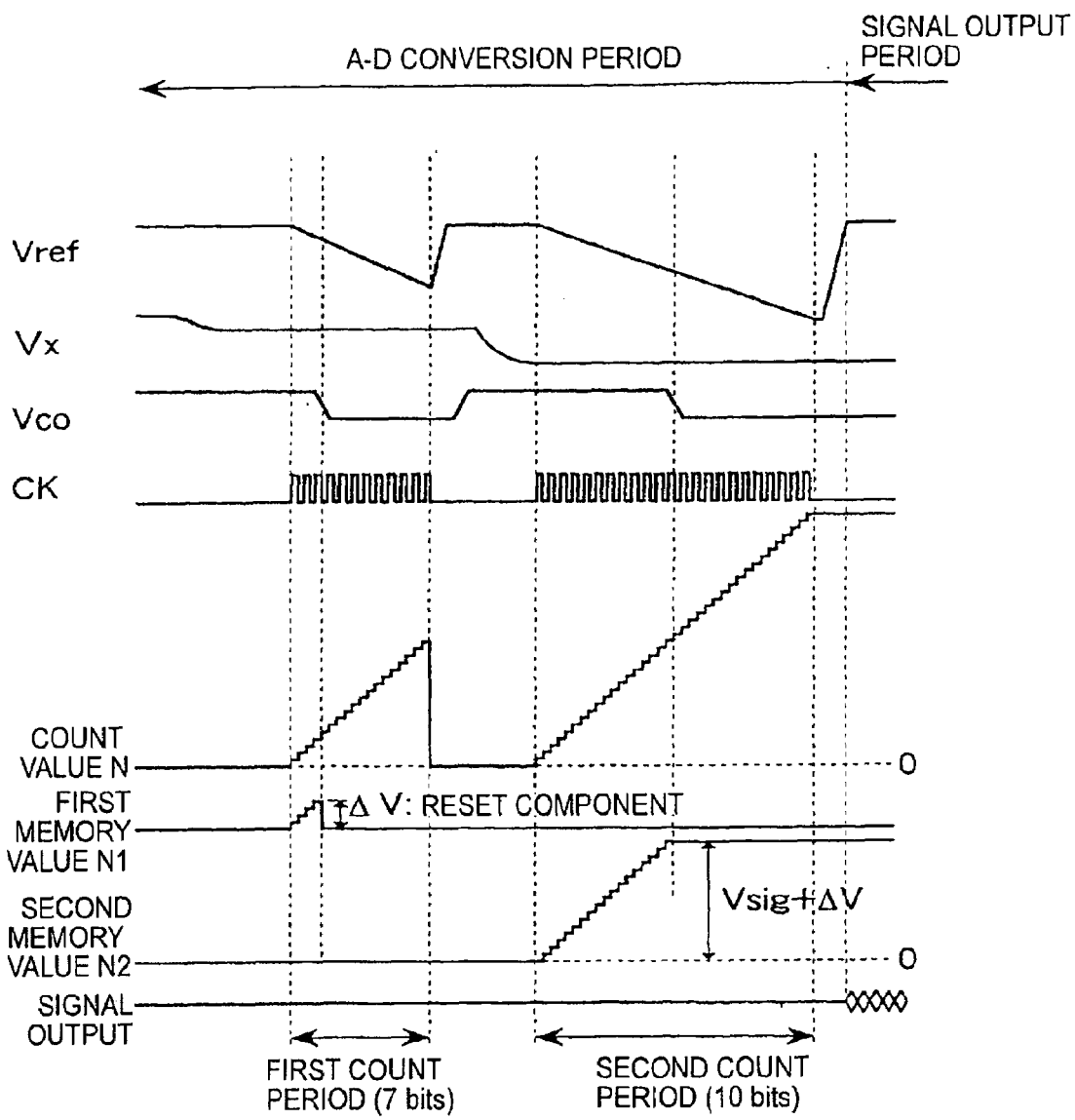
FIG. 16 is a timing chart illustrating the operation of the CMOS image sensor according to the known art.
Figure 17:
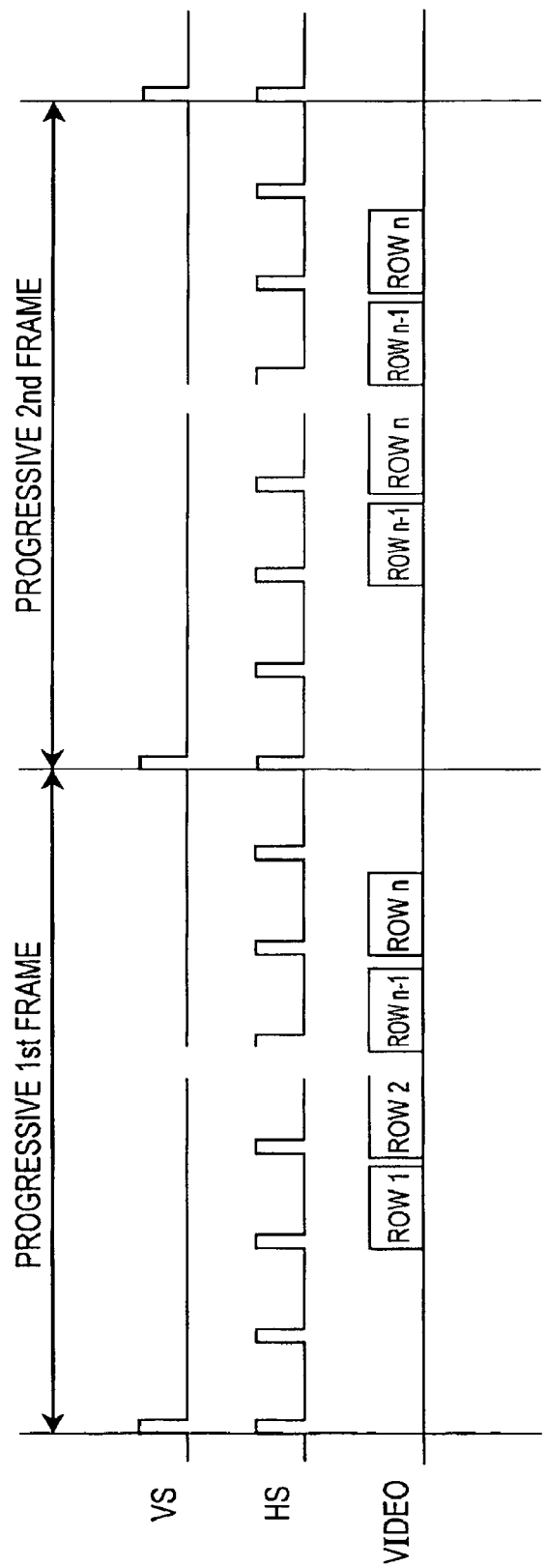
FIG. 17 is a timing chart illustrating an operation of progressive scanning.
Figure 18:
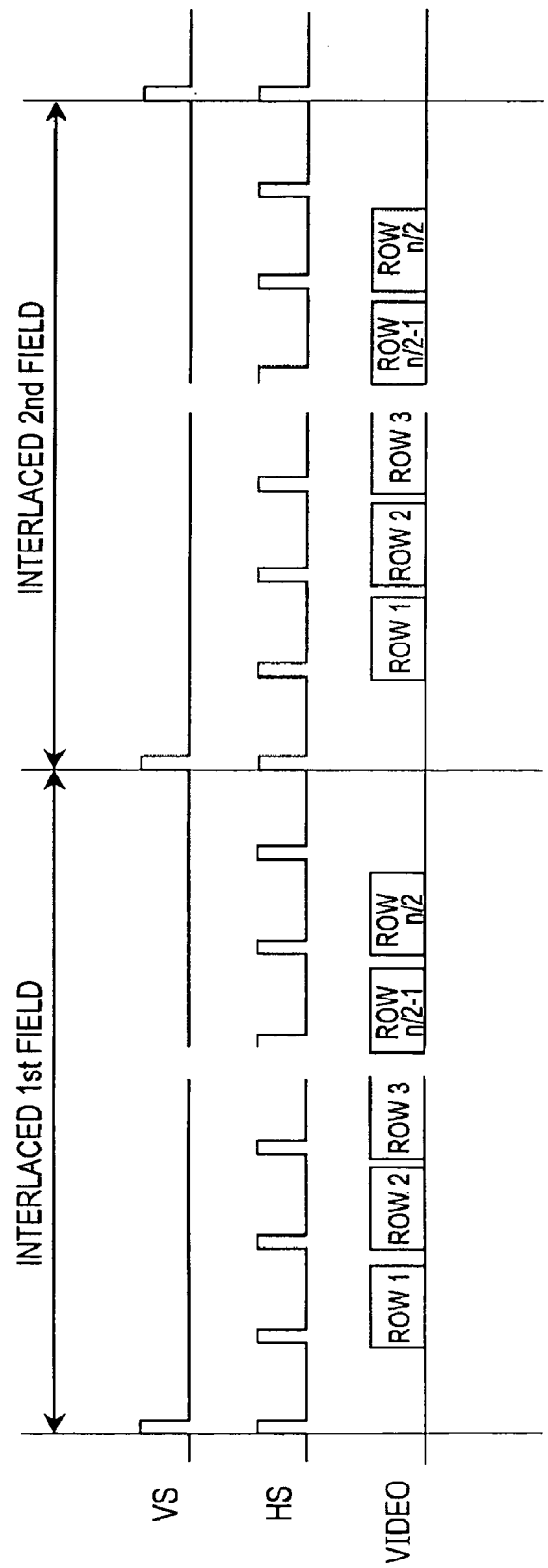
FIG. 18 is a timing chart illustrating an operation of interlaced scanning.

FIG. 14 is a block diagram showing the configuration of a CMOS image sensor 80 including column-parallel ADCs according to a fifth embodiment of the present invention. In the figure, parts which are the same as those in FIG. 8 are denoted by the same reference numerals.

The configuration of the CMOS image sensor 80 including column-parallel ADCs according to this embodiment is basically the same as that of the CMOS image sensor 60 including column-parallel ADCs according to the third embodiment shown in FIG. 8. The difference therebetween is as follows.

That is, in the CMOS image sensor 60 including column-parallel ADCs according to the third embodiment, digital values of pixels are added between odd-numbered columns and between even-numbered columns. In contrast to this, in the CMOS image sensor 80 including column-parallel ADCs according to this embodiment, a selecting switch 81 is provided between the pixel array unit 12 and the column processing unit 14. By using the function of the selecting switch 81, the pair of columns to be added can be arbitrarily selected.

The selecting switch 81 includes two switches 81A and 81B which operate in conjunction with each other. In the switch 81A, a fixed contact a1 is connected to the second column signal line 22-2, a fixed contact b1 is connected to the third column signal line 22-3, and a movable contact c1 is connected to the second ADC 23-2. In the switch 81B, a fixed contact a2 is connected to the third column signal line 22-3, a fixed contact b2 is connected to the second column signal line 22-2, and a movable contact c2 is connected to the third ADC 23-3.

In order to simplify the figure, only the selecting switch 81 between the column signal lines 22-2 and 22-3 is shown in FIG. 14. However, the selecting switch 81 is provided for every two columns in units of adjoining two column signal lines from the second column.

In the CMOS image sensor 80 including column-parallel ADCs according to this embodiment, when the movable contacts c1 and c2 of the selecting switch 81 are connected to the fixed contacts a1 and a2, respectively, analog signals of the pixels in the first, second, third, fourth, . . . columns are converted to digital signals by the ADCs 23-1, 23-2, 23-3, 23-4, . . . , respectively, and the digital signals are held in the ADCS.

Then, as in the CMOS image sensor 60 including column-parallel ADCs according to the third embodiment, control signals M1, M2, M3, M4, . . . are simultaneously output from the column scanning circuit 16 in pairs of M1 and M2, M3 and M4, . . . , so that the digital values held in the memory devices 34 are simultaneously output to the horizontal output lines 17-1 and 17-2 in units of two columns. Then, the digital values output through the horizontal output line 17-1 and the digital values output through the horizontal output line 17-2 are added in the digital adder 61 of N bits.

As a result, the digital adder 61 adds the digital values of the pixels in adjoining (sequential) two columns like this: adds the digital values of the pixels in the first and second columns and then adds the digital values of the pixels in the third and fourth columns. Such addition of pixels between two adjoining columns can be applied to a three-plate image sensor in which color filters of the same color (only R/G/B) are provided on the same sensor.

Furthermore, by combining the adding operation between two columns in the CMOS image sensor 80 according to this embodiment and the adding operation between two rows in the CMOS image sensor 10 according to the first embodiment, an adding operation of 2 rows and 2 columns can be realized. Further, the frame rate can be increased by four times while keeping the sensitivity constant.

On the other hand, when the movable contacts c1 and c2 of the selecting switch 81 are connected to the fixed contacts b1 and b2, respectively, analog signals of the pixels in the first column, the third column, . . . are converted to digital signals by the odd-numbered ADCs 23-1, 23-3, . . . , respectively, and the digital signals are held in the ADCs. Likewise, analog signals of the pixels in the second column, the fourth column, . . . are converted to digital signals by the even-numbered ADCs 23-2, 23-4, . . . , respectively, and the digital signals are held in the ADCs.

Then, as in the CMOS image sensor 60 including column-parallel ADCs according to the third embodiment, the output of each of the odd-numbered ADCs 23-1, 23-3, . . . is output through the horizontal output line 17-1 of an N-bit width, and the output of each of the even-numbered ADCs 23-2, 23-4, . . . is output through the horizontal output line 17-2 of an N-bit width. Then, the digital signals in the odd-numbered columns output through the horizontal output line 17-1 and the digital signals in the even-numbered columns output through the horizontal output line 17-2 are added in the digital adder 61 of N bits.

This operation is the same as that of the CMOS image sensor 60 including column-parallel ADCs according to the third embodiment. With this operation, two pixels can be added between odd-numbered columns and between even-numbered columns. As a result, pixels of same colors can be added when the color filters are arranged in a Bayer pattern, and thus mixture of different colors caused by addition of pixels does not occur.

By combining the adding operation between two columns in the CMOS sensor 80 according to this embodiment and the adding operation between two rows in the CMOS image sensor 50 according to the second embodiment, same colors can be added both between columns and between rows. Therefore, an adding operation of 2 rows and 2 columns can be realized without causing mixture of different colors. Further, the frame rate can be increased by four times while keeping the sensitivity constant.

As described above, in the CMOS image sensor 80 according to this embodiment, the selecting switch 81 is provided between the pixel array unit 12 and the column processing unit 14. With this configuration, the pair of columns to be added can be arbitrarily selected by using the function of the selecting switch 81. Therefore, addition of pixels can be realized both in a single-plate image sensor having a Bayer pattern and a three-plate image sensor by using this circuit configuration.

In this embodiment, two horizontal output lines are provided and the selecting switch 81 is provided between two columns so as to realize addition of two pixels between columns. Alternatively, by providing three or more horizontal output lines and providing the selecting switch 81 among three or more columns, addition of three or more pixels among the columns can be realized.

What is claimed is:

1. A solid-state image pickup device comprising:
   a pixel array unit including unit pixels which are two-dimensionally arranged in a matrix pattern, each unit pixel including a photoelectric converter, and column signal lines corresponding to respective columns of the matrix pattern;
   a row scanning unit selectively controlling each unit pixel of the pixel array unit in units of rows;
   a plurality of analog-digital converting units, each converting an analog signal output from a respective one of the unit pixels in each row selectively-controlled by the row scanning unit through the column signal lines to a respective digital signal, adding the digital signals obtained from a respective plurality of unit pixels, and outputting the added digital signals;
   a column scanning unit controlling output of the digital signals added in the analog-digital converting unit; and
   an output line for transmitting the digital signals output from the analog-digital converting units under control by the column scanning unit.

2. A solid-state image pickup device according to claim 1, wherein each analog-digital converting unit comprises an operating unit for performing digital operation processing, the operating unit performing addition of the digital signals.

3. A solid-state image pickup device according to claim 1, wherein each analog-digital converting unit comprises:
   a comparator for comparing the analog signal output from each unit pixel with a reference voltage; and
   a measuring unit for measuring comparison time in the comparator from the start to the end of a comparing operation, the measuring unit performing addition of the digital signals.

4. A solid-state image pickup device according to claim 3, wherein the measuring unit is a counter which adds the digital signals by repeating a count operation on each analog signal of the plurality of unit pixels.

5. A solid-state image pickup device, comprising:
   a pixel array unit including unit pixels which are two-dimensionally arranged in a matrix pattern, each unit pixel including a photoelectric converter, and column signal lines corresponding to respective columns of the matrix pattern;
   row scanning means for selectively controlling each unit pixel of the pixel array unit in units of rows;
   analog-digital converting means for converting analog signals output from the unit pixels in a row selectively-controlled by the row scanning means through the column signal lines to digital signals, adding the obtained digital signals among a plurality of unit pixels, and outputting the added digital signals;
   column scanning means for controlling output of the digital signals added in the analog-digital converting means; and
   an output line for transmitting the digital signals output from the analog-digital converting means under control by the column scanning means,
   wherein the analog-digital converting means comprises:
      comparing means for comparing the analog signal output from each unit pixel with a reference voltage; and
      measuring means for measuring comparison time in the comparing means from the start to the end of a comparing operation, the measuring means performing addition of the digital signals,
   wherein the measuring means is a counter which adds the digital signals by repeating a count operation on each analog signal of the plurality of unit pixels, and
   wherein the counter is an up/down counter, which performs subtraction by performing a down count and an up count on first and second analog signals output from one of the unit pixels and which performs addition by repeating an up count on each analog signal of the plurality of unit pixels.

6. A method for driving a solid-state image pickup device comprising a pixel array unit including unit pixels which are two-dimensionally arranged in a matrix pattern, each unit pixel including a photoelectric converter, column signal lines corresponding to respective columns of the matrix pattern and a plurality of analog-digital converting units, each analog-digital converting unit being connected to a respective column signal line, the unit pixels being selectively controlled in units of rows, and the method comprising:

converting analog signals output from the unit pixels in a row selected by the selective control through the column signal lines to digital signals via the analog-digital converting units, adding the digital signals of a plurality of unit pixels via the analog-digital converting units, and reading the added digital signals from the analog-digital converting units.

7. A method according to claim 6, wherein the addition is performed among the unit pixels of a plurality of rows.

8. A method for driving a solid-state image pickup device, comprising a pixel array unit including unit pixels which are two-dimensionally arranged in a matrix pattern, each unit pixel including a photoelectric converter, and column signal lines corresponding to respective columns of the matrix pattern, the unit pixels being selectively controlled in units of rows, and the method comprising:

converting analog signals output from the unit pixels in a row selected by the selective control through the column signal lines to digital signals, adding the digital signals among a plurality of unit pixels, and reading the added digital signals, wherein the addition is performed among the unit pixels of a plurality of rows, and wherein the bit accuracy of analog-digital conversion is decreased according to the number of rows to be added and analog-digital conversion time is reduced.

9. A method according to claim 8, wherein, when said number of rows is M, the bit accuracy of analog-digital conversion of N bits is decreased to N–M bits and the analog-digital conversion time is reduced to 1/M.

10. A solid-state image pickup device comprising:

a pixel array unit including unit pixels which are two-dimensionally arranged in a matrix pattern, each unit pixel including a photoelectric converter, and column signal lines corresponding to respective columns of the matrix pattern;

analog-digital converting unit for converting analog signals output from each unit pixel to digital signals including:

a comparing unit for comparing the analog signals with a reference voltage, a measuring unit for measuring comparison time from the start to the end of a comparing operation, and an adding unit for adding a plurality of the digital signals when the measuring unit holds the comparing time.

11. A method for driving a solid-state image pickup device comprising a pixel array unit including unit pixels which are two-dimensionally arranged in a matrix pattern, each unit pixel including a photoelectric converter, and column signal lines corresponding to respective columns of the matrix pattern, the unit pixels being selectively controlled in units of rows, and the system comprising:

converting analog signals output from each unit pixel to digital signals; and wherein the step of converting further comprises:

comparing the analog signals with a reference voltage, measuring comparison time from the start to the end of a comparing operation, and adding a plurality of the digital signals when the analog-digital converting unit holds the comparing time.

* * * * *